(12) United States Patent
Jaklitsch et al.

(10) Patent No.: US 7,904,043 B2
(45) Date of Patent: Mar. 8, 2011

(54) METHOD FOR IMPLEMENTING CONTINUOUS RADIO FREQUENCY (RF) ALIGNMENT IN ADVANCED ELECTRONIC WARFARE (EW) SIGNAL STIMULATION SYSTEMS

(75) Inventors: James J. Jaklitsch, Parkton, MD (US); Jay Markey, York, PA (US); Thomas P. McGrath, Lutherville, MD (US)

(73) Assignee: AAI Corporation, Hunt Valley, MD (US)

( * ) Notice: Subject to any disclaimer, the term of this patent is extended or adjusted under 35 U.S.C. 154(b) by 0 days.

(21) Appl. No.: 12/700,275

(22) Filed: Feb. 4, 2010

(65) Prior Publication Data

US 2010/0136938 A1 Jun. 3, 2010

Related U.S. Application Data

(62) Division of application No. 11/640,364, filed on Dec. 18, 2006, now Pat. No. 7,801,502.

(51) Int. Cl.
  *H04B 17/00* (2006.01)
(52) U.S. Cl. ..................................... 455/226.2
(58) Field of Classification Search ............... 455/67.11, 455/67.14, 226.1, 226.2, 226.4, 296, 303; 375/224; 324/76.21, 76.22, 76.52
  See application file for complete search history.

(56) References Cited

U.S. PATENT DOCUMENTS

| | | | |
|---|---|---|---|
| 3,883,870 A | 5/1975 | Kunz | |
| 4,003,054 A | 1/1977 | Goldstone | |
| 4,227,194 A | 10/1980 | Herman et al. | |
| 4,584,710 A | 4/1986 | Hansen | |
| 4,719,465 A | 1/1988 | Kuroda | |
| 4,866,449 A | 9/1989 | Gaffney | |
| 4,876,489 A | 10/1989 | Cawthorne | |
| 4,905,010 A | 2/1990 | Baechtiger et al. | |
| 5,070,336 A | 12/1991 | Pringle | |
| 5,163,176 A | 11/1992 | Flumerfelt et al. | |
| 5,172,118 A | 12/1992 | Peregrim et al. | |
| 5,172,119 A | 12/1992 | Young et al. | |
| 5,172,120 A | 12/1992 | Slawsby et al. | |
| 5,172,122 A | 12/1992 | Peregrim et al. | |
| 5,172,125 A | 12/1992 | Peregrim et al. | |
| 5,173,702 A | 12/1992 | Young et al. | |
| 5,173,703 A | 12/1992 | Mangiapane et al. | |
| 5,173,707 A | 12/1992 | Mangiapane et al. | |

(Continued)

OTHER PUBLICATIONS

Form PCT/ISA/210 International Search Report, PCT/US07/25789, Jun. 17, 2008.

(Continued)

*Primary Examiner* — Thanh C Le
(74) *Attorney, Agent, or Firm* — Venable LLP; Jeffri A. Kaminski; Kyle D. Petaja

(57) ABSTRACT

A method for using a "B" channel of a dual channel measurement receiver as a transfer standard for power measurement, which may include in an exemplary embodiment: correlating measurements made with an "A" channel to measurements made with an RF Power Meter on one RF signal source, so that readings from the "A" channel are aligned to the RF Power Meter; aligning the "B" Channel to the "A" Channel (Transfer alignment of Channel B to the RF Power Meter), once the "A" channel has been aligned to read the same as the RF Power Meter; and using the "B" Channel as a transfer standard to measure all remaining RF signal sources in the system, on a time-line much faster than may be accomplished using a power meter.

1 Claim, 8 Drawing Sheets

U.S. PATENT DOCUMENTS

| | | |
|---|---|---|
| 5,175,554 A | 12/1992 | Mangiapane et al. |
| 5,184,137 A | 2/1993 | Pozgay |
| 5,185,608 A | 2/1993 | Pozgay |
| 5,223,842 A | 6/1993 | Okurowski et al. |
| 5,225,838 A | 7/1993 | Kanter et al. |
| 5,225,839 A | 7/1993 | Okurowski et al. |
| 5,245,347 A | 9/1993 | Bonta et al. |
| 5,311,550 A | 5/1994 | Fouche et al. |
| 5,315,304 A | 5/1994 | Ghaleb et al. |
| 5,357,257 A | 10/1994 | Nevin |
| 5,754,452 A | 5/1998 | Pupalaikis |
| 5,974,362 A | 10/1999 | Owen |
| 6,064,694 A | 5/2000 | Clark et al. |
| 6,100,841 A | 8/2000 | Toth et al. |
| 6,285,313 B1 | 9/2001 | Wahab et al. |
| 6,486,679 B1 | 11/2002 | Holt |
| 6,498,582 B1 | 12/2002 | Sweeney et al. |
| 7,058,377 B1 * | 6/2006 | Mitsdarffer et al. .......... 455/303 |
| 7,099,669 B2 | 8/2006 | Sheffield |
| 7,126,324 B1 * | 10/2006 | Goncharenko ............ 324/76.52 |
| 7,519,330 B2 * | 4/2009 | Gumm ...................... 455/67.11 |
| 2001/0041566 A1 | 11/2001 | Xanthos et al. |
| 2004/0043795 A1 | 3/2004 | Zancewicz |
| 2004/0108953 A1 | 6/2004 | Chevalier et al. |
| 2006/0228027 A1 | 10/2006 | Matsugu et al. |

OTHER PUBLICATIONS

Form PCT/ISA/237 Written Opinion of the International Searching Authority, PCT/US07/25789, Jun. 17, 2008.

* cited by examiner

Alignment Functional Overview

Matched Filter Measurement
Amplitude Response
Detected Magnitude

Frequency Sweep Cycle

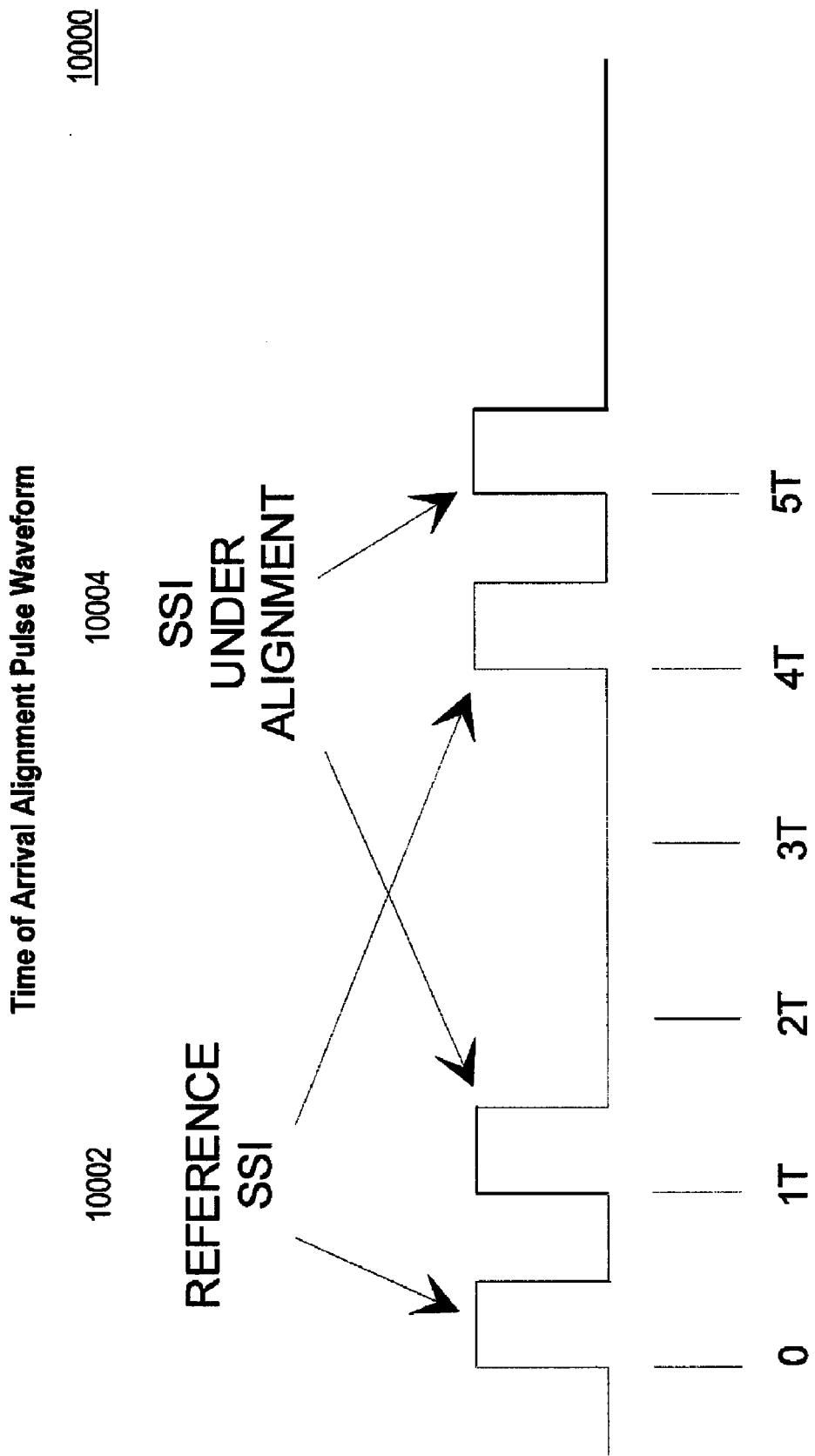

METHOD FOR IMPLEMENTING CONTINUOUS RADIO FREQUENCY (RF) ALIGNMENT IN ADVANCED ELECTRONIC WARFARE (EW) SIGNAL STIMULATION SYSTEMS

CROSS-REFERENCE TO RELATED APPLICATIONS

This application is a divisional of co-pending U.S. patent application Ser. No. 11/640,364, entitled "METHOD FOR IMPLEMENTING CONTINUOUS RADIO FREQUENCY (RF) ALIGNMENT IN ADVANCED ELECTRONIC WARFARE (EW) SIGNAL STIMULATION SYSTEMS" to Jaklitsch, et al. filed on Dec. 18, 2006, of common assignee to the present invention the contents of which are incorporated herein by reference in their entirety.

BACKGROUND OF THE INVENTION

1. Field of the Invention

The present invention relates generally to simulation systems, more particularly to electronic warfare (EW) simulation systems, and even more specifically, to the issue of aligning laboratory EW simulation systems.

2. Related Art

Electronic warfare (EW) simulation systems in a laboratory must be aligned. These simulation systems may typically include multiple signal sources (such as, e.g., but not limited to, modulated microwave synthesizers), in which each of these signal sources may be capable of producing time-interleaved microwave pulses of different frequencies and modulation characteristics, so as to emulate the signal characteristics of a multiplicity of radar emitters. The simulation systems may be arranged to output similar RF signals on multiple channels, with controlled differences in specific parameters between channels.

Such systems must be aligned in order to ensure that the signals these systems produce, on each channel, are accurately calibrated, with respect to each other and with respect to absolute standards, across a wide range of frequency and attenuation. Conventionally, with current technology, these systems are typically aligned in amplitude (RF Power) only, and are not aligned to maintain specific phase relationships from channel to channel. Even so, the conventional alignment process is a time-consuming, tedious operation, and it is not at all uncommon to get reports from users that they spend more time aligning, than they do using, these systems.

There is now an emerging need for improved EW simulation systems. It would be desirable that an EW simulation system be capable of producing microwave signal characteristics with known phase relationships between signal sources. This need implies that the alignment problem, already time-consuming and tedious to the extent that it is a significant impediment to system operation, must be extended to somehow support alignment of phase across frequency. What is needed then is an improved EW simulation system capable of overcoming shortcomings of conventional solutions.

SUMMARY OF THE INVENTION

According to an exemplary embodiment of the present invention, an exemplary feature of this invention may provide a comprehensive, automated method for aligning amplitude, phase, and time, for every signal source in an EW simulator. The EW simulator may contain, in an exemplary embodiment, an arbitrary number of signal sources (such as, e.g., but not limited to, typically, 96 or more). A feature of an exemplary embodiment of the EW simulator may perform alignment on a time-line that permits every signal source in the system to be fully aligned, at every possible frequency and at every possible attenuation state, in, e.g., but not limited to, less than, or about equal to, 15 minutes. In addition, the method disclosed herein, according to an exemplary embodiment, may provide a continuous, on-going alignment of the system so that signal characteristics may be constantly realigned (e.g., but not limited to, approximately once per second) to eliminate effects of thermal drift.

According to an exemplary embodiment, a method of providing an integrated approach to automated system alignment, may include: providing amplifier compression alignment, (which may include characterizing and/or compensating for a parasitic effect); providing continuous internal alignment of phase and amplitude of a synthetic stimulus instrument (SSI) output signal; providing external measurement port alignment; and providing transfer alignment of internal measurement paths.

According to one exemplary embodiment, the method may further include providing power leveling to improve accuracy.

According to one exemplary embodiment, the method may further include providing time angle of arrival alignment.

According to one exemplary embodiment, the method may further include providing pulse width alignment.

According to one exemplary embodiment, the method may include providing continuous internal alignment, which itself may include: a foreground process, wherein the foreground process may include characterizing one or more parameters that are most sensitive to fluctuation with at least one of time and/or temperature, and updating the parameters for all frequency at a high refresh rate; and a background process, where the background process may include characterizing one or more parameters that are less sensitive to fluctuation with at least one of time and/or temperature, and updating the parameters for all frequency at a lower refresh rate.

According to one exemplary embodiment, the method may include where the parameters may include base state phase and/or amplitude.

According to one exemplary embodiment, the method may further include a parametrically extendible measurement cycle, which may include matched-filter coherent measurement processing may include making back-to-back elementary measurements, wherein each of the measurements are phase offset by 180 degrees, to cancel a VSWR error.

According to one exemplary embodiment, the method may include providing amplifier compression alignment, which may include: characterizing the effect of amplifier compression on phase and amplitude may include: driving an attenuation control as required to achieve actual attenuation states in octave increments of dB, for each applicable range of step attenuation; and measuring a super-attenuation and a saturation induced phase contribution (SIPC) at each of the attenuation states, in each of the ranges of step attenuation.

According to one exemplary embodiment, the method may include driving the attenuation control as required to achieve actual attenuation states in the octave increments, which may include: driving the attenuation control as required to achieve actual attenuation states in the octave increments of dB may include at least one of 0, 0.25, 0.5, 1.0, 2.0, 4.0, 8.0, and/or 16.0.

According to one exemplary embodiment, a method of characterizing the effect of each step attenuator state, on phase and amplitude, may include activating each step attenuator state as the sole contributor to attenuation, and measuring at least one of a step attenuator amplitude contribution (SAAC) and/or a step attenuator phase contribution (SAPC).

According to one exemplary embodiment, a method for mapping an arbitrary RF Power command into hardware control signals used to produce a commanded RF Power at a Port output for each frequency, may include: a. providing a level shift that maps an absolute Power Command, in units of dBm, to a relative power command, in units of dBfs; b. providing a step attenuation state parser that computes the appropriate state for the step attenuator, and subtracts a step attenuator amplitude contribution from the relative power command, to compute an AM DAC attenuation; c. providing a super-attenuation function that adjusts the AM DAC attenuation command to produce desired attenuation, adding any additional attenuation as required to compensate for non-linear effects of compression, wherein the super-attenuation function is implemented as a stored data table, in octave increments of dB, for each applicable range of step attenuation, with an exact value determined by means of quadratic interpolation at run time; d. providing a theoretical conversion of the AM DAC attenuation command to hardware bits; and e. providing a frequency-dependent offset for power leveling.

According to one exemplary embodiment, the method may include providing the super-attenuation function in the octave increments of dB, which may include: providing the super-attenuation function in the octave increments of dB which may include at least one of 0, 0.25, 0.5, 1.0, 2.0, 4.0, 8.0, and/or 16.0.

According to another exemplary embodiment, a method for mapping an arbitrary RF Phase Command into hardware phase-shift control signals, as required to produce a commanded RF Phase at the Port output for each frequency, may include: a. computing an aggregate Phase Compensation value from at least one of: i. a base-state phase error, measured at each sub-band of a synthetic stimulus instrument (SSI), ii. a filter induced phase contribution (FIPC) measured at closely spaced frequency increments across each sub-band, stored in data tables, and interpolated at run-time using quadratic interpolation, iii. a step attenuator phase contribution (SAPC), measured at each sub-band of the SSI, and/or iv. a saturation-induced phase contribution (SIPC), characterizing a non-linear phase shift associated with amplifier compression, wherein SIPC compensation is implemented as a stored data table, in octave increments of dB, for each applicable range of step attenuation, with the exact value determined by means of quadratic interpolation at run time; and b. subtracting the Phase Compensation value from the RF Phase Command.

According to one exemplary embodiment, the method may include where the (a) (ii) may include closely spaced frequency increments may include about 200 KHz.

According to one exemplary embodiment, the method may include where the (a) (iv) may include octave increments of dB may include at least one of 0, 0.25, 0.5, 1.0, 2.0, 4.0, 8.0, and/or 16.0.

According to another exemplary embodiment, a method of using a state-estimation filter may include: using a state-estimation filter for computing true values for a step attenuator amplitude contribution (SAAC) and a step attenuator phase contribution (SAPC), in presence of measurement noise.

According to one exemplary embodiment, the method may include where the step attenuator amplitude contribution (SAAC) and the step attenuator phase contribution (SAPC) may be computed as differentials from a full-power reference measurement may include amplitude and phase.

According to another exemplary embodiment, a method for using a "B" channel of a dual channel measurement receiver as a transfer standard for power measurement may include: correlating measurements made with an "A" channel to measurements made with an RF Power Meter on one RF signal source, so that readings from the "A" channel are aligned to the RF Power Meter; aligning the "B" Channel to the "A" Channel (Transfer alignment of Channel B to the RF Power Meter), once the "A" channel has been aligned to read the same as the RF Power Meter; and using the "B" Channel as a transfer standard to measure all remaining RF signal sources in the system, on a time-line much faster than may be accomplished using a power meter.

According to another exemplary embodiment, a receiver apparatus may include: a dual-channel coherent measurement receiver which may include at least one internal channel operative to measure time-division-multiplexed (TDM) feedback signals from each signal source of a synthetic stimulus instrument (SSI); and at least one external channel operative to make direct measurement at an external alignment port output.

Further features and advantages of the invention, as well as the structure and operation of various exemplary embodiments of the invention, are described in detail below with reference to the accompanying drawings.

BRIEF DESCRIPTION OF THE DRAWINGS

FIG. 10 illustrates an exemplary time of arrival alignment pulse waveform that may be used in some embodiments of the present invention.

DETAILED DESCRIPTION OF VARIOUS EXEMPLARY EMBODIMENTS OF THE INVENTION

Overview of an Exemplary Embodiment of the Present Invention

Exemplary embodiments of the invention are discussed in detail below. In describing exemplary embodiments, specific terminology may be employed for the sake of clarity. However, the invention is not intended to be limited to the specific terminology so selected. While specific exemplary embodiments may be discussed, it should be understood that this is done for illustration purposes only. A person skilled in the relevant art will recognize that other components and configurations can be used without parting from the spirit and scope of the invention.

Exemplary embodiments of the present invention may include apparatuses for performing the operations herein. An apparatus may be specially constructed for the desired purposes, or it may comprise a general purpose device selectively activated or reconfigured by a program stored in the device.

Exemplary embodiments of the invention may be implemented in one or a combination of hardware, firmware, and/or software. Exemplary embodiments of the invention may also be implemented as instructions stored on a machine-accessible medium, which may be read and executed by a computing platform to perform the operations described herein. A machine-accessible medium may include any mechanism for storing or transmitting information in a form readable by a machine (e.g., a computer). For example, a machine-accessible medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

Figure 1:
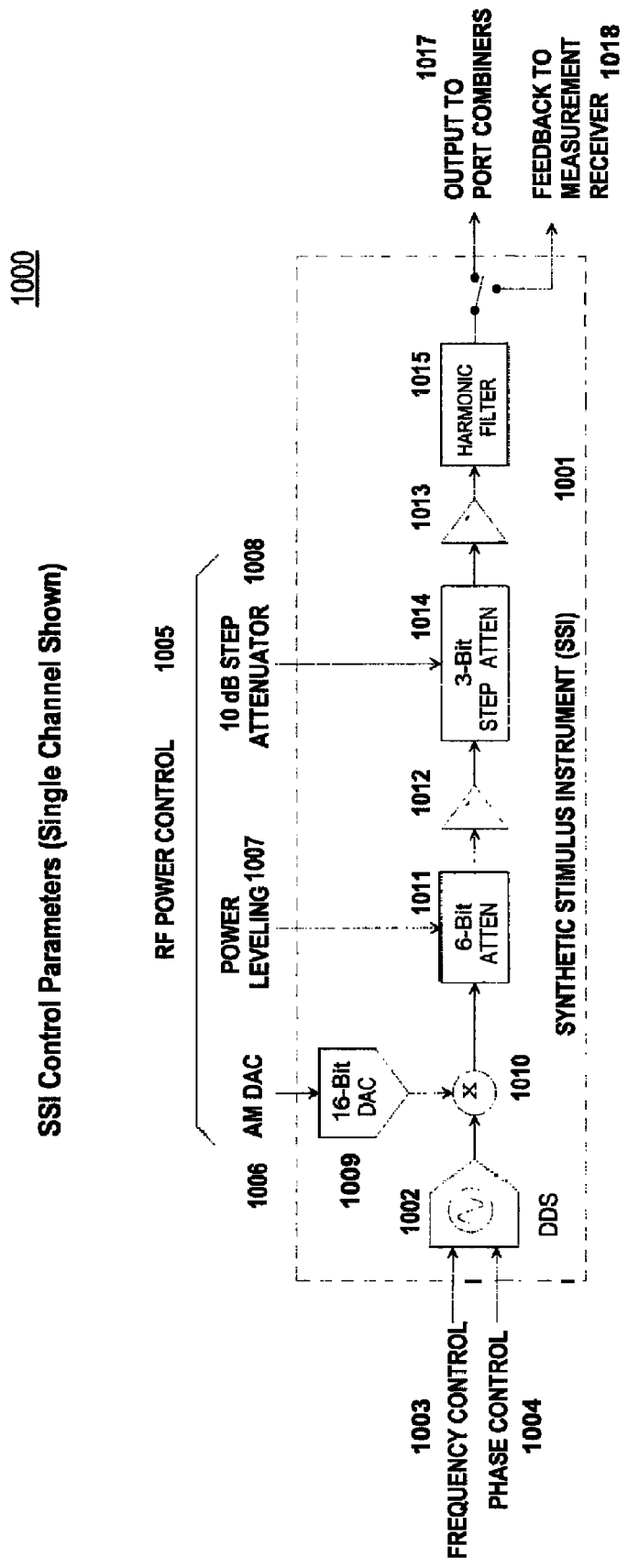
FIG. 1 illustrates exemplary SSI control parameters that may be used in some embodiments of the present invention.

FIG. 1 depicts a diagram 1000 illustrating an exemplary embodiment of an exemplary synthetic stimulus instrument (SSI) 1001, according to an exemplary embodiment of the present invention. Exemplary control parameters for an exemplary RF signal source for an advanced electronic warfare (EW) simulation system are illustrated in FIG. 1. Diagram 1000 illustrates an exemplary simplified schematic of an exemplary particular type of synthesized microwave signal generator, according to an exemplary embodiment, known as a synthetic stimulus instrument (SSI) 1001. The basis of the SSI may be a direct digital synthesizer (DDS) 1002. The DDS 1002 may be programmable, in frequency 1003 and phase 1004 by digital means, and may thus be commanded to produce arbitrary microwave frequencies at arbitrary phase shifts, according to an exemplary embodiment.

The control for RF output power 1005 may be distributed throughout the RF distribution network, and may include, in an exemplary embodiment, three separate components: amplitude modulation (AM) digital to analog converter (DAC) control 1006, power leveling control 1007, and a step attenuator control 1008 (e.g., but not limited to, a 10 dB step attenuator control 1008). The AM DAC control 1006 may provide fine amplitude modulation (AM) of the DDS output 1002 by multiplying this signal 1010 with the output of, e.g., but not limited to, a 16-bit DAC 1009 programmed with the AM DAC command 1006. The power leveling command 1007 may drive, e.g., but not limited to, a 6-bit attenuator 1011, which may provide compensation for excess gain in microwave amplifiers 1011, 1013, at the lower frequencies within a band. The remaining power control element may be, in an exemplary embodiment, the 10 dB step attenuator command 1008. The 10 dB step attenuator command 1008 may drive the step attenuator 1014 to discrete states, in 10 dB (Nominal) increments: (0, 10, 20, 30, 40, 50, & 60 dB). The RF output from the step attenuator 1014 may be routed through a harmonic filter 1015, to a switch 1016. The switch 1016 may allow the output of SSI 1001 to be routed, e.g., but not limited to, either out to port combiners 1017 or back to a measurement receiver 1018 (described further below with reference to FIG. 3).

Figure 2:
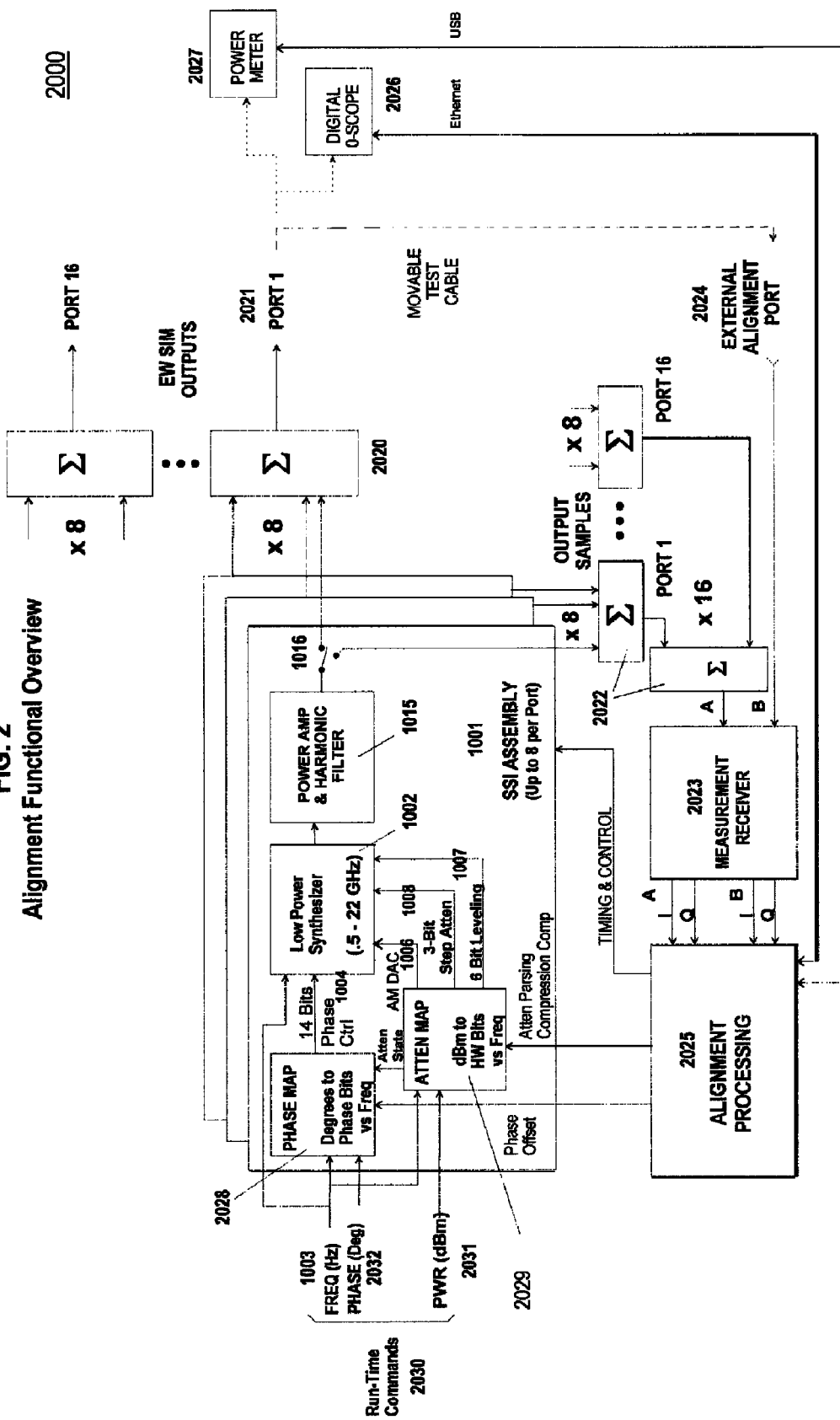
FIG. 2 illustrates an exemplary overview of a function alignment that may be used in some embodiments of the present invention.

FIG. 2 depicts an exemplary embodiment of a diagram 2000 of an exemplary functional overview of the alignment functions. As shown, an EW Tester may be a modular design, including, in an exemplary embodiment, of up to 16 output ports 2021 (Port 1 thru Port 16), in which each port may be driven by up to 8 SSI Assemblies 1001. In smaller systems, all synthesizers and all ports may not be present, but in the most general case, the alignment system must be able to deal with a fully populated tester (128 SSI Assemblies 1001).

The essential alignment problem is the process of building the Phase Map 2028 and Attenuation Map 2029 functions for each SSI Assembly 1001. These functions may include the data conversions that map the run-time commands 2030 for Phase (Degrees) 2032, Frequency (Hz) 1003, and Power (dBm) 2031 into the hardware controls that cause the correct Phase and Power to be produced at the output port 2021 for each frequency. The map functions in an exemplary embodiment may be implemented as a combination of alignment data tables (physically stored internal to each SSI 1001), and run-time processing implemented by each SSI 1001.

The essential alignment problem may be complicated by the fact that the hardware elements are continuously drifting, by significant amounts, as temperature changes and other parasitic effects take place. Instead of building the alignment data tables as a one-time process, the Alignment function must periodically update the data tables, according to an exemplary embodiment. The required update rate may depend on the sensitivity of the specific alignment parameter, and may range from as fast as possible (e.g., less than 1 second) to on-command, according to an exemplary embodiment.

As illustrated in FIG. 2, the output from each SSI 1001 may be switched off line 1016 and routed back, through a multiplexing network 2022, to a measurement receiver 2023. (Only one SSI 1001 at a time may be switched to the internal measurement path, according to an exemplary embodiment.) The measurement receiver 2023 may be tunable across the full SSI frequency band (0.5-22 GHz), and may perform quadrature (I, Q) sampling of the measured signal, in an exemplary embodiment.

Figure 3:
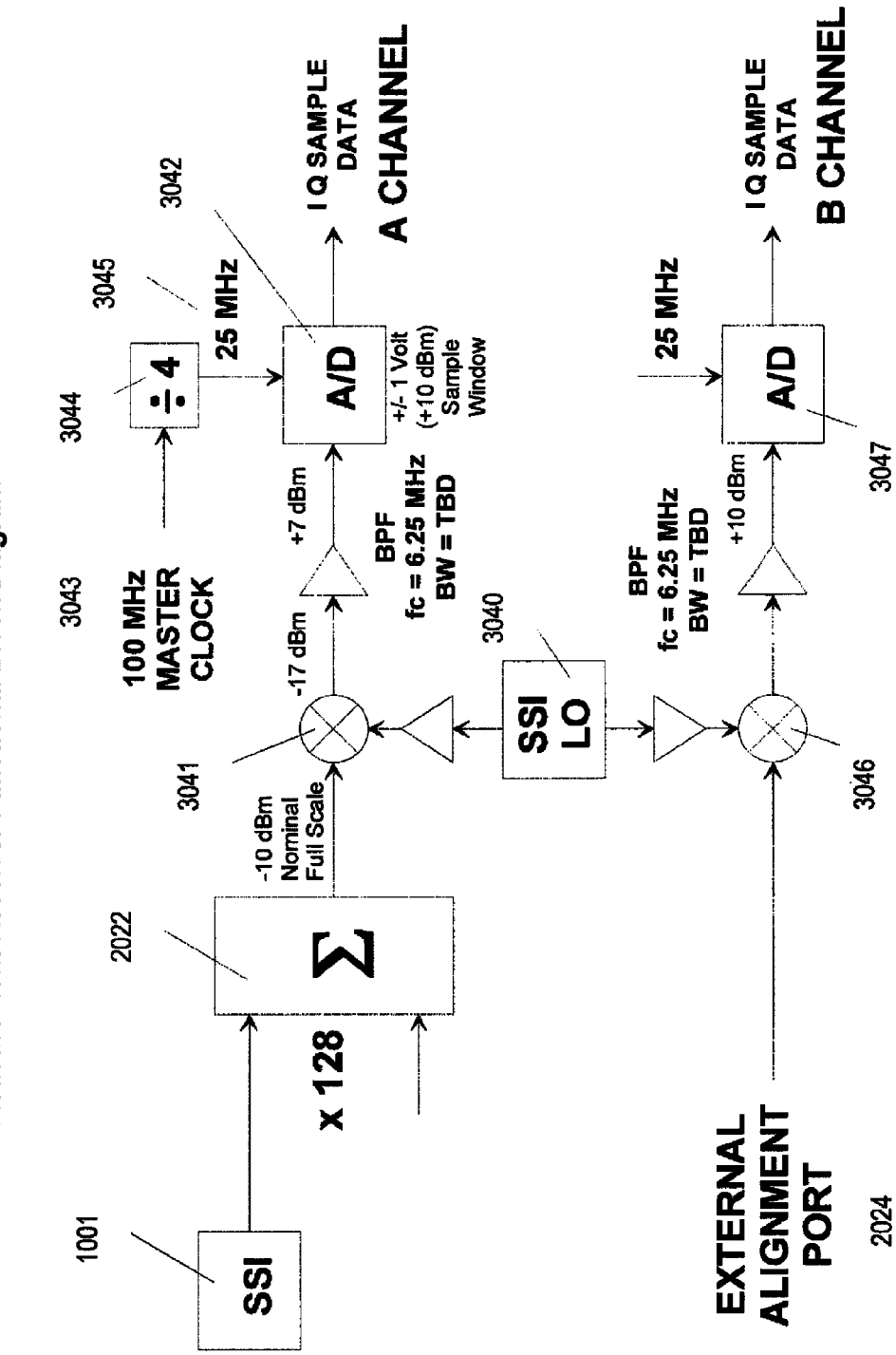
FIG. 3 is a block diagram illustrating an exemplary embodiment of the measurement receiver that may be used in some embodiments of the present invention.

As illustrated in diagram 3000 of FIG. 3, the measurement receiver 2023, according to an exemplary embodiment, has two separate channels. The "A" Channel is the internal measurement path, capable of cycling through all of the SSIs 1001. The "B" Channel is an external alignment port 2024, with a movable test cable that can be manually connected to the output of any port.

The Alignment Processing function 2025, according to an exemplary embodiment, controls the alignment process, switching each SSI 1001 to the internal measurement path 2022, 2023, sweeping it over frequency, and processing the I, Q data to extract phase and amplitude. The processing function also organizes the alignment data tables and exports (Copies) these data tables to the SSI under alignment, in an exemplary embodiment.

The Alignment Process, according to an exemplary embodiment, may include seven separate functions, as follows:

a. Power Leveling
  b. Amplifier Compression Characterization
  c. Continuous Internal Alignment
  d. External Measurement Port Alignment
  e. Transfer Alignment of Internal Measurement Paths
  f. Time Angle of Arrival Alignment
  g. Pulse Width Alignment Power Leveling 1007, according to an exemplary embodiment, is a process that measures the Power Leveling Offset (PLO) 1007 required to correct variations in amplifier gain across the band of frequencies. It is run as part of every power-on sequence, but may also be run on-command (i.e., not while simulations are active). Power leveling is optional, but improves accuracy.

Amplifier Compression Characterization, in an exemplary embodiment, is a process that characterizes the phase and amplitude non-linearities associated with compression characteristics of the RF amplifiers 1012, 1013. It is run, according to an exemplary embodiment, as part of every power-on sequence, but may also be run on-command (i.e., not while simulations are active).

Continuous Internal Alignment, in an exemplary embodiment, is a continuously running process in which, every 8 ms, one of the SSIs is switched off line and routed back to the "A" Channel of the measurement receiver 2023. As illustrated in diagram 6000 of FIG. 6, during the next 8 ms 6057, its phase and amplitude states are measured, in a prioritized foreground/background processing cycle. The readings are corrected for errors in the feedback path 2022, so that they accurately reflect phase and amplitude at the output port 2021. When the measurement sweep is completed, the alignment data tables 2028, 2029 are updated to re-align the SSI 1001. Then the freshly aligned SSI 1001 is placed back on line, and another may be selected for alignment during the next 8 ms. The process continues, according to an exemplary embodiment, cycling through each SSI 1001 at a 8 ms rate, thereby aligning every SSI 1001 in the system, with an update period of 8 ms per SSI (e.g., 0.768 seconds with 96 SSIs 1001 in an exemplary system).

External Measurement Port Alignment, according to an exemplary embodiment, is a process that aligns the "B" Channel of the measurement receiver 2024. This operation, according to an exemplary embodiment, is a two-step process. First, as illustrated in FIG. 2, the amplitude terms for the Internal Measurement Path for $SSI_{1,1}$ are aligned by placing a power meter 2027 on Port 1 2021, then alternately measuring $SSI_{1,1}$ with the external power meter 2027, and again with the "A" Channel of the internal measurement receiver 2023. The amplitude correction factor for the internal path is calculated from the difference in the internal and power meter 2027 readings. Once the amplitude factors for the internal path are known, according to an exemplary embodiment, the power meter 2027 may be removed, and the movable test cable from the "B" channel of the measurement receiver may be connected to Port 1. The measurement process is repeated, according to an exemplary embodiment, this time comparing the known reading on the "A" channel (with amplitude correction applied, so that it accurately reflects power at the Port 1 output) with the unknown reading on the "B" channel. The "B" channel is aligned by computing the External Amplitude Correction Factor (EACF) as the difference between the two readings, according to an exemplary embodiment.

Transfer Alignment of the Internal Measurement Paths, according to an exemplary embodiment, is a process that computes the Internal Alignment Amplitude Correction Factors (IAACF) and Internal Alignment Phase Correction Factors (IAPCF) values for each measurement path by correlating measurements of the output port (i.e., obtained from the external measurement port) with measurements from the internal alignment feedback paths.

Time Angle of Arrival Alignment, according to an exemplary embodiment, as illustrated in diagram 10000 of FIG. 10, is a process that aligns the time of arrival of pulse envelope (Pulse Modulator Control). The process consists of measuring the pulse time of arrival at the output for each SSI (Via Digital O-Scope 2026), then programming an offset register in each SSI 1001 to cause the pulses to be aligned in time.

Exemplary Definitions, Nomenclature and Acronyms

Asset Allocation

Interval: Interval at which available SSI hardware assets are assigned to specific emitter pulse streams in the EW Simulator. Nominally 2 ms.

Background

Cycle: Portion of the 8 ms Frequency Sweep Cycle dedicated to measurement of lower priority (higher stability) phase and amplitude parameters.

BSA: Base State Amplitude (dBm). This is the Normalized Measured Amplitude, vs frequency, when the applicable SSI is driven to the Continuous Internal Alignment Base State (SSI DAC Pwr=SCBSP, Step Atten=0, SSI Programmed Phase=0). The BSA is a function of SSI Sub-band (603 values, taken at the center index of each sub-band).

BSP: Base State Phase (Degrees). This is the Normalized Measured Phase, vs frequency, when the applicable SSI is driven to the Continuous Internal Alignment Base State (SSI DAC Pwr=SCBSP, Step Atten=0, SSI Programmed Phase=0). The BSP is a function of SSI Sub-band (603 values, taken in the center of each sub-band).

dBfs: Relative Power, in dB, referenced to Full Scale.

dBm: Absolute Power, in dB, referenced to 1 milliwatt.

EACF: External Alignment Correction Factor. This value, in units of dB, must be added to amplitude measurements (dBfs) obtained from the "B" Channel of the Measurement Receiver. The EACF is a function of SSI Sub-band (603 values, taken in the center of each sub-band).

FIPC: Filter Induced Phase Contribution (Degrees). This is the incremental phase shift, within a sub-band, due to distance in frequency away from the center of the sub-band. The FIPC is a function of SSI sub-band and frequency, and is measured across each sub-band in 200 KHz increments.

Foreground

Cycle: Portion of the 8 ms Frequency Sweep Cycle dedicated to measurement of high priority (lower stability) phase and amplitude parameters.

Frequency

Sweep Cycle: 8 ms time-slice required to measure all foreground frequency points for a single SSI.

HSPD: High-Side Phase Differential. This value, in units of degrees, is the differential between the phase measurement of the sub-band center index taken with a high-side LO and the same measurement made with a low-side LO. It is used for measurement normalization.

IAACFx,y: Internal Alignment Amplitude Correction Factor for SSIx,y. This value, in units of dB, must be added to amplitude measurements (dBfs) obtained from the "A" Channel of the Measurement Receiver for SSIx,y. The IAACF is a function of SSI Sub-band (603 values, taken in the center of each sub-band).

IAPCFx,y: Internal Alignment Phase Correction Factor for SSIx,y. This value, in units of degrees, must be added to Phase measurements (Degrees) obtained from the "A" Channel of the Measurement Receiver for SSIx,y. The IAPCF is a function of SSI Sub-band and frequency (Up to 190 values per sub-band).

PLO: Power Leveling Offset. The attenuator value in dB, as determined during the Power Leveling process, required to set RF output power to its optimum value. (603 values, taken in the center of each sub-band).

SAACi: Step Attenuator Amplitude Contribution, in dB, for the ith 10 dB increment. Six values are measured at the center of each frequency sub-band, corresponding to −10 dB, −20 dB, −30 dB, −40 dB, −50 dB, and −60 dB, respectively.

SAPCi: Step Attenuator Phase Contribution, in degrees, for the ith 10 dB increment. Six values are measured at the center of each sub-band, corresponding to −10 dB, −20 dB, −30 dB, −40 dB, −50 dB, and −60 dB, respectively.

SCBSM Saturation-Compensated Base State Magnitude. By definition, the SCBSM for a particular frequency is a condition in which the SSI AM DAC is driven at −10 dBfs plus the super attenuation value (dB) for −10 dBfs (In Range 0), at that frequency.

SCBSΦ Saturation-Compensated Base State Phase. By definition, the SCBSΦ for a particular frequency is a condition in which the SSI Phase Control is driven at 0 Degrees minus the SIPC value (Degrees) for −10 dBfs (In Range 0), at that frequency.

SIPC: Saturation Induced Phase Contribution, in degrees. This is the amount of additional phase shift induced by operating the SSI AM DAC near its full scale (0 dBfs through −10 sBfs).

SSIx,y: Denotes the yth SSI on Port x. For example, $SSI_{3,1}$ denotes the $1^{st}$ SSI of Port 3.

Super-Attenuation: The amount of additional attenuation (Above the ideal characteristic) that must be added to compensate the non-linear effects of amplifier saturation. By convention, super-attenuation values are referenced to FS power, and are therefore negative (e.g., −2 dB@−10 dBfs). Super attenuation is a non-linear characteristic that is small near FS, and increases to a relatively constant magnitude as attenuation increases (e.g., −0.2 dB@−1 dBfs, −1 dB@−3 dBfs, −2 dB@−dBfs, −2 dB@−20 dBfs, etc). Super-attenuation is computed from values measured during Amplifier Compression Characterization. Measurements are taken at the center of each frequency sub-band, in three ranges, corresponding to the −10 dB, −20 dB, and −30 dB through −60 dB states of the step attenuator.

Measurement Process

Measurement Receiver

The Measurement Receiver is functionally illustrated in FIG. 3, according to an exemplary embodiment. Each of the up to 128 SSIs 1001 may be routed through the summing multiplexer 2022, one at a time, to be measured on the "A" Channel A/D Converter 3042. The "B" Channel A/D Converter 3047 may provide a parallel measurement of the External Alignment Port 2024. An additional SSI 3040 may serve as a tunable local oscillator (SSI LO), common to both channels, according to an exemplary embodiment, and may be offset from the SSI 1001 being measured by 6.25 MHz, to produce a 6.25 MHz IF at the A/D Converters 3042, 3047.

The A/D Converters 3042,3047, according to an exemplary embodiment, use coherent matched-filter sampling to take I & Q data samples of the 6.25 MHz IF. The sampling rate is 25 MHz, according to an exemplary embodiment, which is four times the 6.25 MHz IF 3043, 3044, 3045. The samples are processed, in a matched filter scheme, to extract I & Q values, in an exemplary embodiment.

The SSI architecture, according to an exemplary embodiment, is internally divided into 37 MHz (Nominal) sub-bands. In order to maximize stability, the SSI LO 3040 must be kept within the same sub-band as the SSI 1001 under test. This may be done, according to an exemplary embodiment, as follows:

a) When the SSI 1001 under test is in the upper half of the sub-band, the SSI LO 3040 is set 6.25 MHz below the measurement frequency (Low-side measurement), according to an exemplary embodiment.

b) When the SSI 1001 under test is in the lower half of the sub-band, the SSI LO 3040 is set 6.25 MHz above the measurement frequency (High-side measurement), according to an exemplary embodiment.

c) The sub-band center frequency is measured twice, according to an exemplary embodiment; once as a low-side measurement, and again as a high-side measurement. The low-side measurement is used as the phase and amplitude reference for the sub-band. The difference between the high-side and low-side measurements of the center frequency is used to compute phase and amplitude correction factors (high-side phase correction (HSPD) and high-side amplitude correction (HSAD)) to apply to all high-side measurements in that sub-band.

Basic Measurement Cycles

Figure 4:
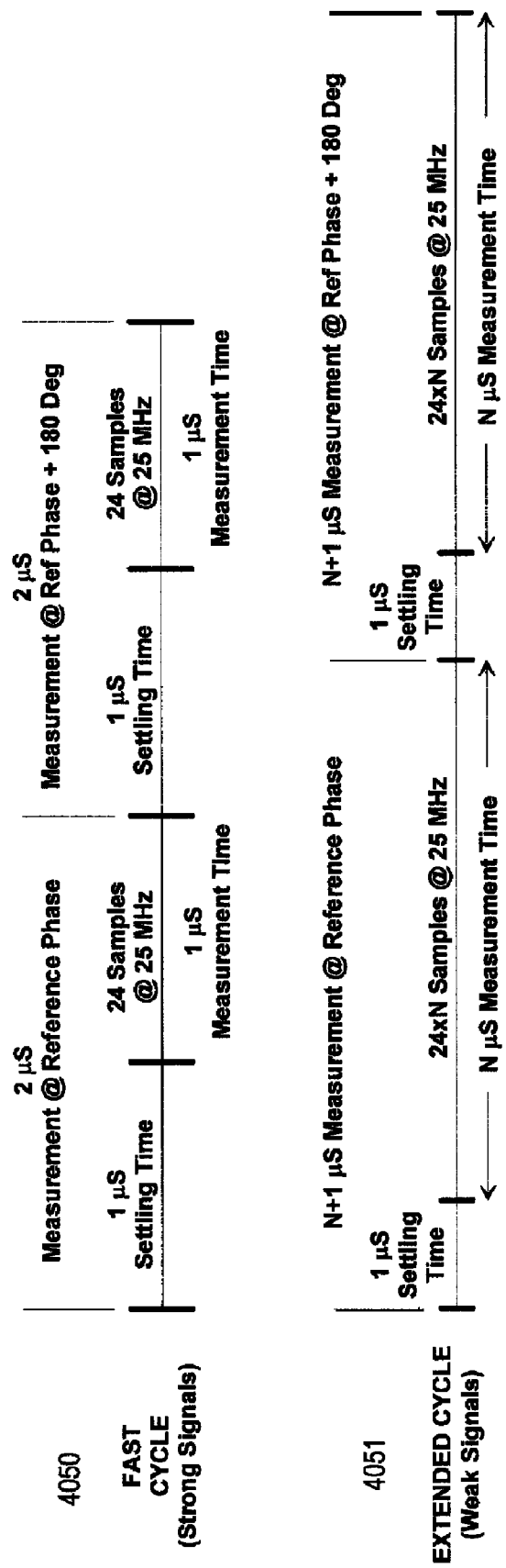
FIG. 4 illustrates an exemplary measurement cycle that may be used in some embodiments of the present invention.

The Alignment process, according to an exemplary embodiment, uses a basic measurement cycle (Single measurement of phase and amplitude), as illustrated in diagram 4000 of FIG. 4. This basic cycle, according to an exemplary embodiment, is actually a compound measurement, using differential processing to cancel voltage standing wave ratio (VSWR) interference effects. For further information about VSWR cancellation, see U.S. patent application Ser. No. 11/369,986, entitled "Method and System for Eliminating VSWR Errors in Magnitude Measurements," and see U.S. patent application Ser. No. 11/369,997, entitled "Method and System for Eliminating VSWR Errors in Phase and Amplitude Measurements," of common assignee to the present invention, the contents of which is incorporated herein by reference in its entirety. It consists of back-to-back elementary measurements, taken with the signal phase offset by 180° between the two.

Two measurement cycle timelines are shown, according to an exemplary embodiment: Fast 4050 and Extended 4051. The only difference between the timelines is the number of microseconds, N, over which the elementary measurements are integrated. The fast cycle (N=1; 4 μs total duration) is used with strong signals, and gives the quickest measurement response, according to an exemplary embodiment. The extended cycle (N>1; 2N+2 μs total duration) is a parametric extension of the cycle that allows for longer measurement dwell in cases of low signal to noise ratio (SNR), according to an exemplary embodiment. Regardless of the length of the measurement dwell (N), all timelines allow a 1-microsecond settling time for the SSI signal to transition and settle to steady-state before the A/D samples are collected.

For each of the two elementary measurements made during a measurement cycle, the A/D samples are processed to produce an estimate of the In-Phase (I) and Quadrature-Phase (Q) components of the measured signal. The processing to extract I and Q values from the A/D samples (Si) is as follows:

$$I = (1/12N) \sum_{i=0}^{6N-1} S_{4i} - S_{4i+2}$$

$$Q = (1/12N) \sum_{i=0}^{6N-1} S_{4i+1} - S_{4i+3}$$

For example, in the special case of the Fast Cycle (N=1), the elementary I and Q values are computed from the following equations, according to an exemplary embodiment:

$$I=\frac{1}{12}[(S0-S2)+(S4-S6)+(S8-S10)+(S12-S14)+(S16-S18)+(S20-S22)]$$

$$Q=\frac{1}{12}[(S1-S3)+(S5-S7)+(S9-S11)+(S13-S15)+(S17-S19)+(S21-S23)]$$

Figure 5:
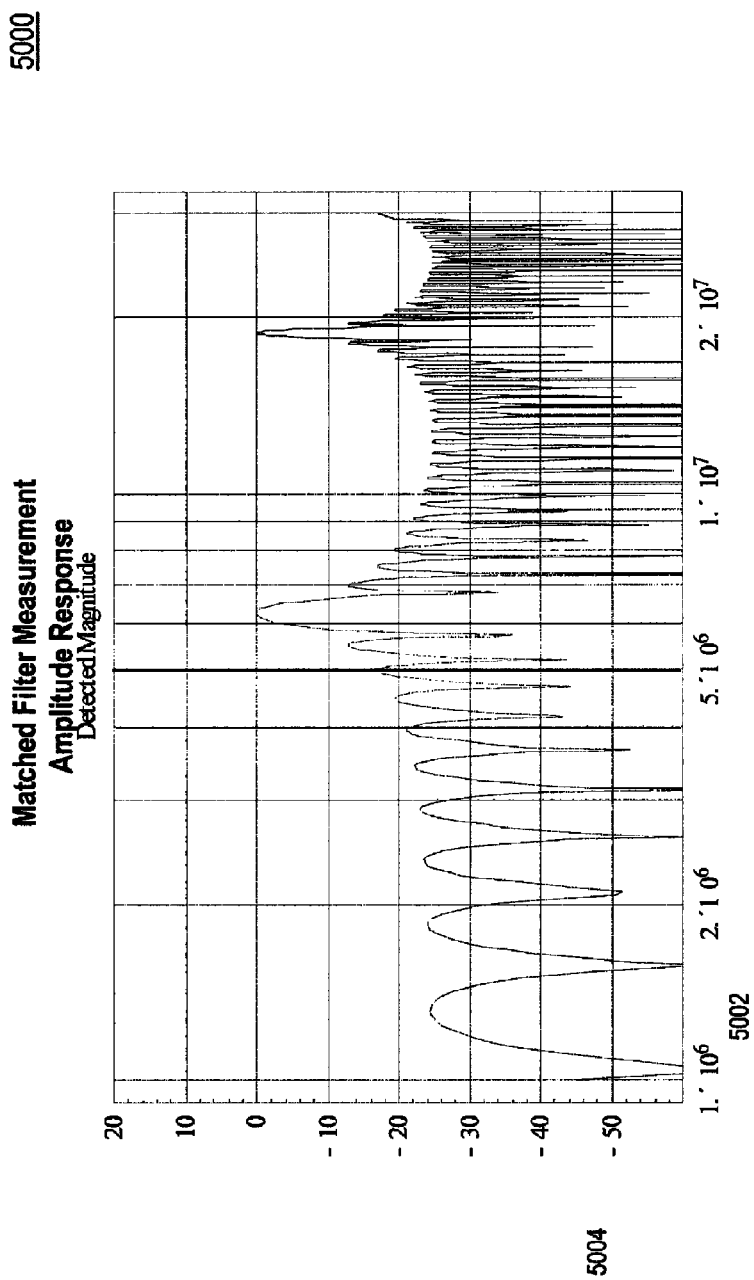
FIG. 5 illustrates an exemplary matched filter measurement amplitude response that may be used in some embodiments of the present invention.

The I and Q detection processing detailed above, according to an exemplary embodiment, is a matched filter to the 6.25 MHz IF waveform. Effective Bandwidth is approximately 1 MHz for the Fast Cycle. The Detection Transfer Function (DTF) for the fast cycle is shown, according to an exemplary embodiment, in chart 5000 of FIG. 5. The extended cycle DTF has the same shape, but the pass-band becomes narrower as the integration time is extended.

Computing Measured Amplitude & Phase

The compound measurement process illustrated in FIG. 4 cancels voltage standing wave ratio (VSWR) interference by making two elementary measurements, inverting the signal phase between them, and using differential processing to compute the composite result. This process, according to an exemplary embodiment, may include the following steps:

The first elementary measurement is made, according to an exemplary embodiment, with the signal under test set to its reference phase (0° offset). The A/D data is processed, per the Basic Measurement Cycles of FIG. 4 discussed above, to compute a first estimate of the I & Q components of the signal under test ($I_1$ & $Q_1$).

The second elementary measurement is made with the signal under test inverted in phase (180° offset). The A/D data is processed, per Basic Measurement Cycles of FIG. 4 discussed above, to compute a second estimate of the I & Q components of the signal under test ($I_2$ & $Q_2$).

A true reading for the signal I & Q components is computed as follows:

$$I=(I_1-I_2)/2 \quad Q=(Q_1-Q_2)/2$$

The true Amplitude and true Phase of the signal under test is computed from the true readings of the I & Q components, in accordance with the following relations:

$$\text{Amplitude(dBfs)}=20 \text{ Log } [(\text{Sqrt}[I^2+Q^2]/ADCfs)]$$

$$\text{Phase(Deg)}=(180/Pi)\text{ArcTan } [Q/I]$$

Where: 1. ADCfs is the full scale reading of the A/D
2. "ArcTan" is a 4-quadrant Arc Tangent function Measurement Normalization Each measurement that is taken must be Normalized, according to an exemplary embodiment, in phase and amplitude, so that it accurately represents phase and amplitude at the applicable output port. This process involves several steps, as follows, according to an exemplary embodiment:

a. Compute Measured Amplitude (dBfs) and Measured Phase (Deg) per Section Basic Measurement Cycles, & Computing Measured Amplitude & Phase, above;

b. If applicable, compensate Measured Amplitude and Phase for High-Side LO;

c. Add the appropriate IAACF (dB) to the Compensated Measured Amplitude (dBfs) to compute the Normalized Measured Amplitude (dBm); and/or d. Add the IAPCF (Degrees) to the Compensated Measured Phase (Degrees) to Compute the Normalized Measured Phase.

Measurements may be made with either a high-side or low-side LO, per the Measurement Receiver 2023 (discussed with reference to FIGS. 2 and 3) above. If the LO is on the low side, the Compensated Measured Phase (CMP) is simply the measured phase, and the Compensated Measured Amplitude (CMA) is simply the measured amplitude. If, however, the LO is on the high side, the CMP is the measured phase plus the High Side Phase Differential (HSPD), and the CMA is the measured amplitude plus the High Side Amplitude Differential:

If[LO=Low Side] then:
CMP=Measured Phase;
CMA=Measured Amplitude;
ELSE:
CMP=Measured Phase+HSPD;
CMA=Measured Amplitude+HSAD;

Each SSI 1001 has an associated IAACF and IAPCF data table (Amplitude and Phase vs Frequency). IAACF data is stored for the center of each sub-band, and is valid for all frequencies in the sub-band. IAPCF is stored in 200 KHz increments, so there is one IAPCF value stored for each frequency used for internal alignment. Normalized measurements are produced by simply adding the specific correction factors to the compensated measured data.

Note: Measurements taken on the "B" Channel must also be normalized as noted above. However, EACF is used in place IAACF in step c, and step d is omitted (No phase correction, other than for LO side, is made on the external channel).

Power Leveling

Power Leveling 1007, according to an exemplary embodiment, serves to correct variations in amplifier gain and compression across the band of frequencies. This correction is applied, according to an exemplary embodiment, in a separate 6-bit digital attenuator 1011, so as not to consume dynamic range in the SSI AM DAC 1009.

Power Leveling 1007, according to an exemplary embodiment, may include adjusting the full scale power out-put of each SSI 1001 so that it is approximately +2 dBm, or is saturated, which ever is less (i.e., +2 dB provides head-room for Continuous Internal Alignment to make adjustments as gains change with temperature, but channels will not have reserve power at the upper band edges, and will likely saturate before the +2 dB reserve level is met).

Power Leveling 1007, according to an exemplary embodiment, is run as part of every power-on sequence, but may also be run on-command (Not while simulations are active). The output of Power Leveling 1007 is a table of values for the 6-Bit digital attenuator 1011 as a function of frequency (Part of the ATTEN MAP function 2029 illustrated in diagram 8000 of FIG. 8, and described further in reference thereof). At run-time, the appropriate value must be retrieved from the table and loaded into the 6-Bit Leveling Attenuator whenever the frequency is updated, according to an exemplary embodiment. This update must be synchronized with the update of other attenuators, according to an exemplary embodiment, so as to prevent glitching.

It is important to note that the Microwave amplifiers can exhibit erratic behavior when they are in hard saturation, according to an exemplary embodiment. For this reason, the digital attenuator must be driven with enough bits to ensure that the amplifiers are not saturated, then attenuation gradually removed until the amplifiers reach the desired output power, or begin to saturate, in an exemplary embodiment. The process is summarized as follows, according to an exemplary embodiment:

a. Select the SSI 1001 to be leveled and route its output to the Measurement Receiver 2023;

b. Apply half scale (16 dB) to the Digital Attenuator;

c. Set the SSI frequency to the center of the first sub-band;

d. Wait 1 ms to ensure amplifiers have time to exit saturation;

e. Measure Amplitude from the Measurement Receiver 2023 (Fast Cycle);

f. Decrement Digital Attenuator Code (+0.5 dB nominal step);

| | |
|---|---|
| Range 0: | Step Attenuator = 0 dB |
| Range 1: | Step Attenuator = −10 dB |
| Range 2: | Step Attenuator = −20 dB |

TABLE 1

Measurement Parameters for Amplifier Compression Alignment

| RANGE | MEASUREMENT ($Atten_{Desired}$) | ACCURACY THRESHOLD | APPROX SNR @ A/D | MEAS INTEGRATION TIME "N" | MEAS CYCLE TIME |
|---|---|---|---|---|---|
| 0 | 0 dB Reference | N/A | 65 | 1 μs | 4 μs |
| | −0.25 dB | ±0.05 dB | 65 | 1 μs | 4 μs |
| | −0.5 dB | ±0.05 dB | 65 | 1 μs | 4 μs |
| | −1.0 dB | ±0.1 dB | 64 | 1 μs | 4 μs |
| | −2.0 dB | ±0.1 dB | 63 | 1 μs | 4 μs |
| | −4.0 dB | ±0.2 dB | 61 | 1 μs | 4 μs |
| | −8.0 dB | ±0.2 dB | 57 | 1 μs | 4 μs |
| | −16.0 dB | ±0.2 dB | 49 | 1 μs | 4 μs |
| 1 | 0 dB Reference | N/A | 65 | 1 μs | 4 μs |
| | −0.25 dB | ±0.05 dB | 55 | 1 μs | 4 μs |
| | −0.5 dB | ±0.05 dB | 55 | 1 μs | 4 μs |
| | −1.0 dB | ±0.1 dB | 54 | 1 μs | 4 μs |
| | −2.0 dB | ±0.1 dB | 53 | 1 μs | 4 μs |
| | −4.0 dB | ±0.2 dB | 51 | 1 μs | 4 μs |
| | −8.0 dB | ±0.2 dB | 47 | 1 μs | 4 μs |
| | −16.0 dB | ±0.2 dB | 39 | 2 μs | 6 μs |
| 2 | 0 dB Reference | N/A | 65 | 1 μs | 4 μs |
| | −0.25 dB | ±0.05 dB | 45 | 1 μs | 4 μs |
| | −0.5 dB | ±0.05 dB | 45 | 1 μs | 4 μs |
| | −1.0 dB | ±0.1 dB | 44 | 1 μs | 4 μs |
| | −2.0 dB | ±0.1 dB | 43 | 1 μs | 4 μs |
| | −4.0 dB | ±0.2 dB | 41 | 1 μs | 4 μs |
| | −8.0 dB | ±0.2 dB | 37 | 2 μs | 6 μs |
| | −16.0 dB | ±0.2 dB | 29 | 12 μs | 26 μs |
| | Total Measurement Time (1 Iteration): | | | | 124 μs | g. Measure Amplitude from the Measurement Receiver 2023 (Fast Cycle); and/or h. Compute the dB change of most recent measurement with respect to the previous measurement.

If the change is greater than a threshold (Default=0.1 dB), and the output power is less than +2 dBm, according to an exemplary embodiment, decrement the digital attenuator code & repeat steps g & h. Else, store the attenuator value as the Power Leveling Offset (PLO) for that sub-band, and move the SSI frequency to the center of the next sub-band.

The process is repeated, according to an exemplary embodiment, for each SSI sub-band between 0.5 MHz and 22 GHz (603 pts), with frequency set to the center of the sub-band. Approximate time to build the table of values is 0.7 seconds per SSI 1001, or 96 SSIs in 70 seconds, according to an exemplary embodiment.

Amplifier Compression Alignment

A purpose of the Amplifier Compression Alignment, according to an exemplary embodiment, is to characterize the non-linearity (Compression Response) of the composite chain of microwave amplifiers (12, 13) between the SSI digital source 1002 and the Port Output 1005. Because the amplifiers and attenuation controls are distributed throughout the chain, there are potential non-linear effects associated with both the SSI AM DAC 1009 and the Step Attenuators 1014. This issue is addressed by characterizing the compression response in three ranges, as follows, according to an exemplary embodiment:

The data from Range 2 is valid for all Step Attenuator states beyond −20 dB (i.e., −30, −40, −50, −60), according to an exemplary embodiment. This is due to the fact that nonlinear effects associated with the Step Attenuator 1014 become insignificant once it is down 20 dB, and the only nonlinear effect remaining is associated with the SSI AM DAC 1009, which is common for all higher attenuation states.

In each range, phase and amplitude measurements are made at the following discrete attenuation states (dB): −0.25, −0.5, −1.0, −2.0, −4.0, −8.0, −16.0 (Attenuation additional to the Step Atten). These seven data points characterize the saturation phenomena, according to an exemplary embodiment. At run-time, the SSI 1001 computes the exact value for Super-Attenuation and SIPC by completing a quadratic interpolation of Super-Attenuation and SIPC values measured at these data points, according to an exemplary embodiment.

The process operates by driving the SSI AM DAC 1009 to whatever value is required to produce the desired attenuation, within a specified tolerance, then recording the phase and super-attenuation measurements for that attenuation state, according to an exemplary embodiment. The measurement parameters for all measurements required for Amplifier Compression Alignment are shown in Table 1, for an exemplary embodiment.

The measurements use a search algorithm that begins with the nominal value for desired attenuation, measures the actual attenuation, and corrects the initial estimate by the differential (in dB), according to an exemplary embodiment. A maximum of three iterations (On Average) are required to converge on each attenuation point, according to an exemplary embodiment. Total time for Amplifier Compression Alignment is therefore estimated as follows, according to an exemplary embodiment:

124 µs/Iteration/sub-band×3 Iterations×603 sub-bands=0.224 seconds per SSI

Thus, estimated time required for Amplifier Compression Alignment for the PLAID Configuration (96 SSIs) is 21.5 seconds, according to an exemplary embodiment.

Amplifier Compression Measurement Process

Amplifier Compression Alignment, according to an exemplary embodiment, is run in each SSI sub-band, with frequency set to the center of the sub-band. Since both Super-Attenuation and SIPC are relatively stable across a sub-band, the measured data produces composite values for use anywhere within the sub-band, in an exemplary embodiment.

The process for measuring the Amplifier Compression Characteristics is summarized as follows, according to an exemplary embodiment:

a. Select the SSI to be characterized and route its output to the Measurement Receiver;
b. Set the SSI frequency to the center of the sub-band;
c. Apply the Power Leveling correction data for that frequency;
d. Set the appropriate Step Attenuator State for the Range to be measured;
e. Drive the SSI AM DAC to Full Scale (0 dBfs);
f. Measure Reference Amplitude ($Amp_{Ref}$; dBfs);
g. Drive the SSI AM DAC to achieved desired attenuation ($Atten_{Desired}$), per the search algorithm detailed below;
h. Compute Super-Attenuation: Super-Atten=AM DAC Control−$Atten_{Act}$;
i. Record Super-Attenuation (dB) and Phase (Deg) vs attenuation data point;
j. Repeat Steps e and f for each attenuation data point (7, per Table 1);
k. Compute SIPC from measured phase values by subtracting the phase value measured at the −16 dB attenuation data point from each phase measurement:

$SIPC_n = Phase_{Meas,n} - Phase_{Meas,-16 dB}$;

l. Repeat Steps d through k for each Range (3, per Table 1); and/or
m. Repeat Steps b through l for each sub-band (603, per Appendix C).

Note: SIPC is defined as the incremental phase shift (e.g., delta phase) induced as the amplifier is driven into saturation, according to an exemplary embodiment. This implies that the SIPC at high levels of attenuation is zero (By definition). The −16 dB attenuation data point therefore becomes the phase reference for SIPC, as no saturation-induced effect is expected below this level, in an exemplary embodiment (The phase shift associated with each step attenuator state is determined by the Continuous Alignment Process, and is not part of SIPC).

Search Algorithm

Because the compression characteristics cause the Command-to-Actual attenuation transfer function to be nonlinear, the command required to achieve the desired level of attenuation will differ from its nominal value, according to an exemplary embodiment. It is necessary, therefore, to iteratively drive the SSI AM DAC to converge on the correct value of attenuation, in an exemplary embodiment. The purpose of the following algorithm is to converge as rapidly as possible, according to an exemplary embodiment:

a. Start with AM DAC Control=$Atten_{Desired}$ (dBfs);
b. Measure Amplitude ($Amp_{Meas}$; dBfs), and Phase ($Phase_{Meas}$; Deg), using integration time specified in Table 1;
c. Compute Attenuation: $Atten_{Act} = Amp_{Meas} - Amp_{Ref}$;
d. Error (dBfs)=$Atten_{Desired} - Atten_{Act}$;
e. If Abs[Error]<Threshold, Stop; Return AM DAC Control, $Atten_{Act}$, and $Phase_{Meas}$;
f. Iterate Control: AM DAC Control$_{n+1}$=AM DAC Control$_n$+Error; and/or g. Repeat steps c thru e until d is true.

Amplifier Compression Data Reduction & Export

The measurement process described above, according to an exemplary embodiment, results in Data Tables for Super-Atten & SIPC (7 values per range, 3 ranges, 603 sub-bands). This must be exported to the SSI 1001 under alignment for use at run-time.

This data is interpolated at run-time, internal to the SSI 1001, using piece-wise quadratic interpolation. Since the piece-wise interpolation operates between 3 ordered pairs, the 7 attenuation data points are grouped as shown in Table 2, each group being valid over the specified range of interpolation, according to an exemplary embodiment.

TABLE 2

Data Groupings for Piece-wise Quadratic Interpolation

| GROUP | RANGE OF INTERPOLATION (AM DAC PWR, per FIG. 3.1-3) | DATA PAIR | x | f(x) |
|---|---|---|---|---|
| 0 | 0 to −1.0 dB | {$x_0, f_0$} | −0.25 dB | f(−0.25 dB) |
|   |   | {$x_1, f_1$} | −.5 dB | f(−0.5 dB) |
|   |   | {$x_2, f_2$} | −1.0 dB | f(−1.0 dB) |
| 1 | −1.0 to −4.0 dB | {$x_0, f_0$} | −1.0 dB | f(−1.0 dB) |
|   |   | {$x_1, f_1$} | −2.0 dB | f(−2.0 dB) |
|   |   | {$x_2, f_2$} | −4.0 dB | f(−4.0 dB) |
| 2 | −4.0 to −16.0 dB | {$x_0, f_0$} | −4.0 dB | f(−4.0 dB) |
|   |   | {$x_1, f_1$} | −8.0 dB | f(−8.0 dB) |
|   |   | {$x_2, f_2$} | −16.0 dB | f(−16.0 dB) |

Continuous Internal Alignment Process

Note: Power Leveling and Amplifier Compression Alignment must be run prior to activating the Continuous Internal Alignment process, and the PLO correction factors developed in Power Leveling must be applied to the 6-bit attenuator as the Continuous Internal Alignment process runs, according to an exemplary embodiment. The amplitude and phase contributions of the Power Leveling function are captured in the base state measurements, in an exemplary embodiment.

There are three aspects to the Continuous Internal Alignment function, as follows, according to an exemplary embodiment:

a. Frequency Sweep Cycle (see diagram 6000 of FIG. 6);
b. Data Export to the SSI 1001; and/or
c. Run-time Data Application in the SSI 1001.

Frequency Sweep Cycle

Figure 6:
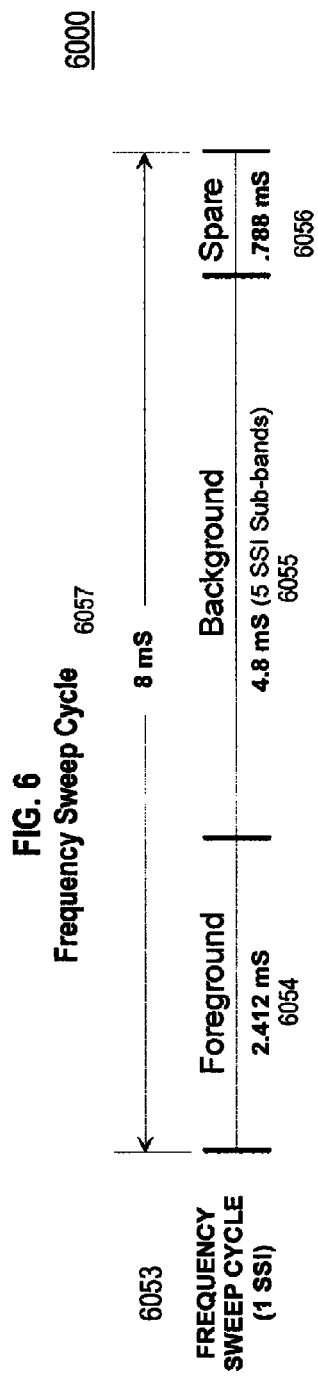
FIG. 6 illustrates an exemplary frequency sweep cycle that may be used in some embodiments of the present invention.

The Continuous Internal Alignment process, according to an exemplary embodiment, is run in 8 ms time slices 6057, as illustrated in diagram 6000 of FIG. 6. Each SSI 1001 is switched to the internal measurement path for alignment, on a rotating basis, for one 8 ms time slice, or Frequency Sweep Cycle 6053, according to an exemplary embodiment. These 8 ms time slices are synchronous with the 2 ms Asset Allocation Interval, so switching an SSI to the measurement receiver does not disrupt emitter pulse trains in the EW simulator, according to an exemplary embodiment.

The foreground cycle 6054 measures the base-state phase and amplitude at the center of each sub-band, according to an exemplary embodiment. Measurements are made using the Fast Cycle 4050. At 4 microseconds per measurement, 2.412 ms are required to complete the sweep of all 603 sub-bands. These are the high priority measurements, designed to stabilize thermally induced phase drift. All foreground measurements are completed in a single 8 ms time-slice, with the result that foreground measurements are updated each alignment cycle (i.e., every 0.768 seconds with 96 SSIs present).

The background cycle 6055, according to an exemplary embodiment, conducts more detailed measurements at a slower update rate. These are the lower priority measurements of quasi-static parameters (e.g., parameters that have much lower thermal sensitivity). The background process completely characterizes 5 of the 603 sub-bands during an 8 ms time-slice, rotating the group of 5 with each pass through the alignment cycle, so that all 603 sub-bands have been measured after 121 passes through the alignment cycle. (Update Rate with 96 SSIs present=121×0.768=93 seconds.) Background measurements include a detailed mapping of filter-induced phase pull (200 KHz increments, or 188 measurements across each sub-band), as well as the phase and amplitude characteristics of each of six step-attenuator states (Center frequency of each sub-band, times 6 attenuator states), according to an exemplary embodiment. The measurement timing for background measurements is specified in Table 3, according to an exemplary embodiment.

TABLE 3

Timing for Background Measurements

| PARAMETER | NUMBER OF MEASUREMENTS PER SUB-BAND | APPROX SNR @ A/D | INTEGR TIME (N) | MEAS TIME | EXTENDED TIME PER SUB-BAND |
|---|---|---|---|---|---|
| HSPD/HSAD | 1 | 55 | 1 μs | 4 μs | 4 μs |
| FIPC | 188 (Ave) | 55 | 1 μs | 4 μs | 752 μs |
| SAPC/SAAC Reference (0 dB) | 1 | 65 | 1 μs | 4 μs | 4 μs |
| SAPC/SAAC (−10 dB) | 1 | 55 | 1 μs | 4 μs | 4 μs |
| SAPC/SAAC (−20 dB) | 1 | 45 | 1 μs | 4 μs | 4 μs |
| SAPC/SAAC (−30 dB) | 1 | 35 | 1 μs | 4 μs | 4 μs |
| SAPC/SAAC (−40 dB) | 1 | 25 | 3 μs | 8 μs | 8 μs |
| SAPC/SAAC (−50 dB) | 1 | 15 | 16 μs | 34 μs | 34 μs |
| SAPC/SAAC (−60 dB) | 1 | 5 | 72 μs | 146 μs | 146 μs |
| Total Background Measurement Time (1 Sub-band): | | | | | 960 μs |

The rate at which individual SSIs 1001 are aligned is dependent on how many SSIs are in the system. SSIs 1001 are rotated on a 8 ms basis (e.g., one Frequency Sweep Cycle 6053 per SSI 1001), and sequence continuously through each SSI 1001 in the system. The resulting alignment rates for typical configurations are summarized in Table 4, according to an exemplary embodiment.

TABLE 4

Alignment Update Rates as a Function of Installed SSIs

| CONFIGURATION | # OF SSIs | SWEEP CYCLE | ALIGNMENT REFRESH RATE FOREGROUND | BACKGROUND |
|---|---|---|---|---|
| Maximum: 16 Port × 8 Deep | 128 | 8 mS | 1.024 Sec | 123.9 Sec |
| Large: 16 Port × 6 Deep | 96 | 8 mS | 0.768 Sec | 92.9 Sec |
| Moderate: 8 Port × 7 Deep | 56 | 8 mS | 0.448 Sec | 54.2 Sec |
| Small: 4 Port × 4 Deep | 16 | 8 mS | 0.128 Sec | 15.5 Sec |
| Minimal: 2 Port × 2 Deep | 4 | 8 mS | 0.032 Sec | 3.87 Sec |

Foreground Measurements

The foreground Frequency Sweep 6054, as described below, is conducted at power levels approximately 10 dB below full scale (SSI AM DAC Magnitude=SCBSM; Step Atten=0 dB, Programmed Phase=SCBSP), according to an exemplary embodiment. This is the Internal Alignment Base State, and is approximately 10 dB below full scale to ensure that the non-linear effects of power amplifier saturation are not a contaminating influence to the alignment, according to an exemplary embodiment.

Base-State Phase and Amplitude

Figure 7:
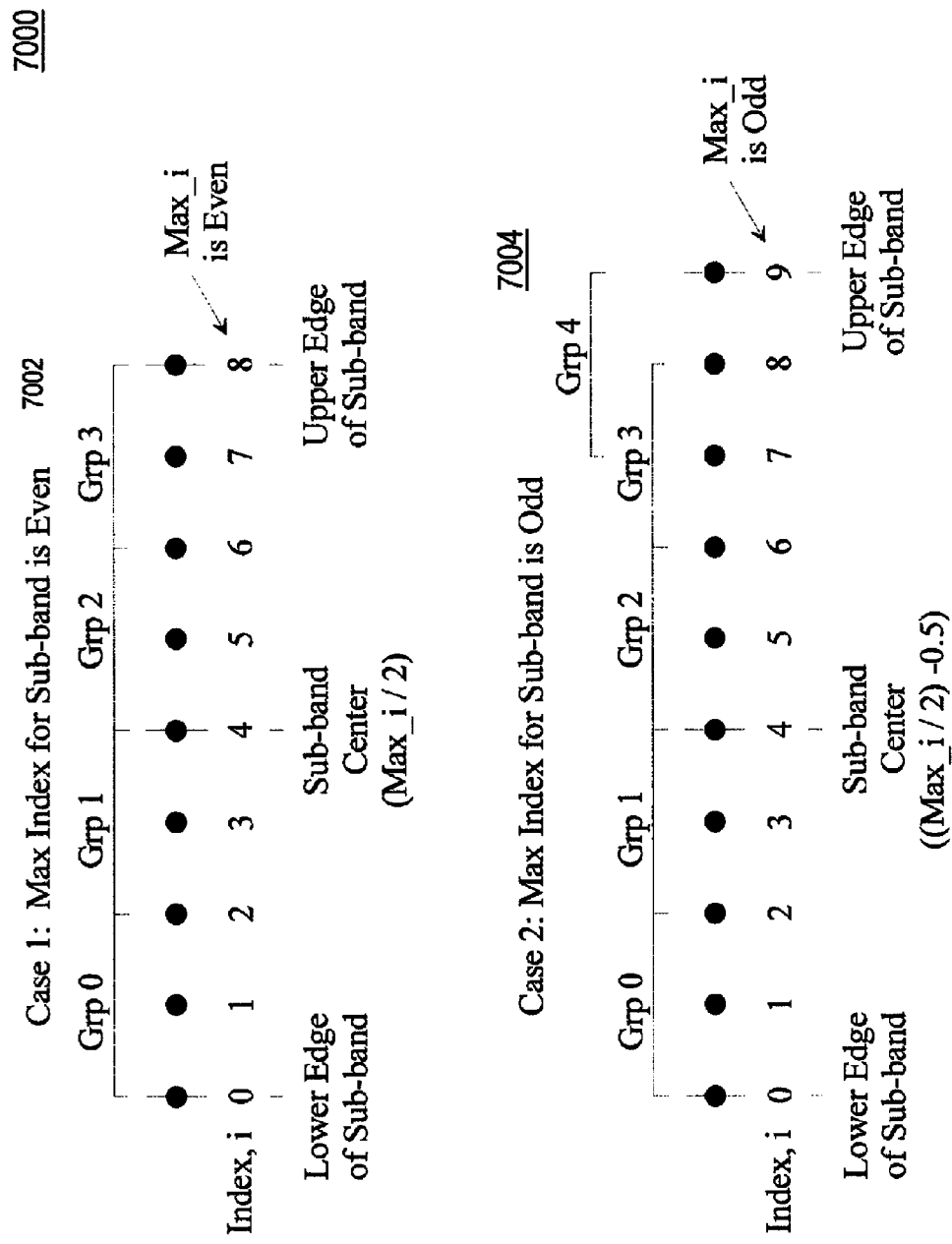
FIG. 7 illustrates exemplary piece-wise interpolation groupings that may be used in some embodiments of the present invention.

The Base State Phase (BSP) and Base State Amplitude (BSA), according to an exemplary embodiment, are measured at the center of each sub-band (See diagram 7000 of FIG. 7). Both parameters are computed from a single fast-cycle measurement, according to an exemplary embodiment. All measurements are made with the SSI driven to the Internal Alignment Base State (SSI AM DAC Magnitude=SCBSM; Step Atten=0 dB, Programmed Phase=SCBSΦ), according to an exemplary embodiment. BSA data is the Normalized Measured Amplitude (dBm). BSP data is the Normalized Measured Phase (Degrees), according to an exemplary embodiment.

Background Measurements

High-Side Phase and Amplitude Differentials

The High-Side Differentials are measured at the center of each sub-band (See diagram 7000 of FIG. 7), at exactly the same point and at exactly the same drive level (e.g., SSI driven to the Internal Alignment Base State) as is used for the foreground (BSA/BSP) measurements, according to an exemplary embodiment. The only difference is that a High-Side LO is used for measuring the differentials, according to an exemplary embodiment.

The High-Side Differentials for phase and amplitude, (HSPD) and (HSAD), respectively, are defined as follows:

HSPD=BSP−Partially Normalized Measured Phase

HSAD=BSA−Partially Normalized Measured Amplitude

In this context, partial normalization denotes that the path-loss corrections described in Measurement Normalization, above, are applied, but correction for High-Side LO is not, according to an exemplary embodiment.

Filter-Induced Phase Contribution

FIPC Measurement

Filter Induced Phase Contribution, according to an exemplary embodiment, is measured across a sub-band, in 200 KHz increments. All FIPC measurements are made at the Internal Alignment Base State (SSI AM DAC Magnitude=SCBSM; Step Atten=0 dB, Programmed Phase=SCBSΦ), according to an exemplary embodiment. Measurements are made on either side of the sub-band center frequency, in e.g., but not limited to, 200 KHz increments, according to an exemplary embodiment.

Note: The center frequency is not measured as part of FIPC, according to an exemplary embodiment. Per the discussion above with reference to the measurement receiver 2023 and FIG. 3, all measurements in the upper half of the sub-band are made with a Low-Side LO, while all measurements in the lower half are made with a High-Side LO. The HSPD/HSAD correction factors apply to all high-side measurements, per Measurement Normalization, above, according to an exemplary embodiment.

The arrangement of FIPC measurements within a sub-band is illustrated in diagram 7000 for case 1 7002 and case 2 7004 of FIG. 7. As shown, an Index system is used to represent the number of exemplary 200 KHz increments from the lower frequency edge of the band, according to an exemplary embodiment. The Indexing system simplifies frequency referencing and minimizes data storage requirements, according to an exemplary embodiment. FIG. 7 is a simplified exemplary schematic. There are many more index points across the sub-band, and the max index (Max_i) is typically either 185 or 190, according to an exemplary embodiment.

The concept for correcting for FIPC is to sample Phase on a dense grid across frequency, then, during system run-time, use piece-wise quadratic interpolation to compute the precise FIPC correction, according to an exemplary embodiment. FIG. 7 also illustrates the set groupings for the piece-wise interpolation, according to an exemplary embodiment.

Because the sub-bands vary in width, the number of index points across the band is also a variable, in an exemplary embodiment. If the maximum index is Even (Case 1 in FIG. 7), the Sub-band center is the actual frequency mid-point, and the groupings are even and symmetrical. The following relationships apply, according to an exemplary embodiment:

Lower Edge=0 Upper Edge=Max_$i$ Center=Max_$i$/2

Number of Interpolation Groups=Max_$i$/2

Interpolation Group=Floor[$i$/2]; for $0 \leq i <$ Max_$i$

If the maximum index is Odd (Case 2 in FIG. 7) the Sub-band center is the nearest index below the actual frequency mid-point, and the groupings are asymmetrical, in an exemplary embodiment. An extra group is required to interpolate the last 200 KHz, according to an exemplary embodiment. The following relationships apply, according to an exemplary embodiment:

Lower Edge = 0

Upper Edge = Max_I

Center = (Max_i/2) − 0.5

Number of Interpolation Groups = 1 + Floor[Max_i/2]

Interpolation Group = Floor[$i$/2]; for $0 \leq i <$ Max_i − 1
= Floor[Max_i/2]; for Max_i − 1 $\leq i <$ Max_i FIPC Data Reduction & Export The measurement process described above results in Data Tables for FIPC (200 KHz increments, arranged by Index, Approx 188 (Ave) per sub-band, 603 sub-bands), according to an exemplary embodiment. This must be exported to the SSI 1001 under alignment for use at run-time, according to an exemplary embodiment.

This data is interpolated at run-time, internal to the SSI 1001, using piece-wise quadratic interpolation. Since the piece-wise interpolation operates between 3 ordered pairs, the FIPC data points are grouped as shown in Table 5, each group being valid over the specified range of interpolation, according to an exemplary embodiment.

TABLE 5

Data Groupings for Piece-wise Quadratic Interpolation of FIPC

| GROUP | RANGE OF INTERPOLATION (Intra-band Frequency Index) | DATA PAIR | x | f(x) |
|---|---|---|---|---|
| 0 | 0 to 2 | $\{x_0, f_0\}$ | 0 | FIPC(0) |
|   |        | $\{x_1, f_1\}$ | 1 | FIPC(1) |
|   |        | $\{x_2, f_2\}$ | 2 | FIPC(2) |
| 1 | 2 to 4 | $\{x_0, f_0\}$ | 2 | FIPC(2) |
|   |        | $\{x_1, f_1\}$ | 3 | FIPC(3) |
|   |        | $\{x_2, f_2\}$ | 4 | FIPC(4) |
| . | | | | |
| N | 2N to 2N + 2 (Case 1: Max_i is Even) | $\{x_0, f_0\}$ | 2N | f(2N) |
|   |   | $\{x_1, f_1\}$ | 2N + 1 | f(2N + 1) |
|   |   | $\{x_2, f_2\}$ | 2N + 2 | f(2N + 2) |
| N − 1 | 2N − 2 to 2N (Case 2: Max_i is Odd) | $\{x_0, f_0\}$ | 2N − 2 | f(2N − 2) |
|   |   | $\{x_1, f_1\}$ | 2N − 1 | f(2N − 1) |
|   |   | $\{x_2, f_2\}$ | 2N | f(2N) |
| N | 2N − 1 to 2N + 1 (Case 2: Max_i is Odd) | $\{x_0, f_0\}$ | 2N − 1 | f(2N − 1) |
|   |   | $\{x_1, f_1\}$ | 2N | f(2N) |
|   |   | $\{x_2, f_2\}$ | 2N + 1 | f(2N + 1) |

Step Attenuator Contributions

The step attenuator 1014 contributions (Amplitude and Phase, vs frequency), according to an exemplary embodiment, are measured during the background cycle of the Continuous Internal Alignment process. This process, according to an exemplary embodiment, produces a series of 6 values for SAAC (Amplitude) and SAPC (Phase), corresponding to the six attenuation states (10, 20, 30, 40, 50, & 60 dB).

Because the measurements of SAAC and SAPC contain relatively high noise (Particularly at high attenuation states), and these parameters are generally very stable (~100 ppm/° C.), the actual value of SAAC and SAPC will be taken as the output of a state-variable estimator, as noted below, according to an exemplary embodiment.

Parameter Measurements

The values for SAAC and SAPC are computed as differentials from a full-power Reference Measurement (Amplitude and Phase), according to an exemplary embodiment. All Measurements are to be made with the SSI AM set to full scale, according to an exemplary embodiment. For each sub-band, SAAC and SAPC values are computed as follows, according to an exemplary embodiment:

SAAC Ref=Normalized Measured Amplitude(Step Atten=0 dB)

$SAAC_0$=0(By definition)

$SAAC_1$(Meas)=Normalized Measured Amplitude (Step Atten=−10 dB)−SAAC Ref $SAAC_2$(Meas)=Normalized Measured Amplitude (Step Atten=−20 dB)−SAAC Ref $SAAC_3$(Meas)=Normalized Measured Amplitude (Step Atten=−30 dB)−SAAC Ref $SAAC_4$(Meas)=Normalized Measured Amplitude (Step Atten=−40 dB)−SAAC Ref $SAAC_5$(Meas)=Normalized Measured Amplitude (Step Atten=−50 dB)−SAAC Ref $SAAC_6$(Meas)=Normalized Measured Amplitude (Step Atten=−60 dB)−SAAC Ref SAPC Ref=Normalized Measured Phase(Step Atten=0 dB)

$SAPC_0$=0(By definition)

$SAPC_1$(Meas)=Normalized Measured Phase(Step Atten=−10 dB)−SAPC Ref $SAPC_2$(Meas)=Normalized Measured Phase(Step Atten=−20 dB)−SAPC Ref $SAPC_3$(Meas)=Normalized Measured Phase(Step Atten=−30 dB)−SAPC Ref $SAPC_4$(Meas)=Normalized Measured Phase(Step Atten=−40 dB)−SAPC Ref $SAPC_5$(Meas)=Normalized Measured Phase(Step Atten=−50 dB)−SAPC Ref $SAPC_6$(Meas)=Normalized Measured Phase(Step Atten=−60 dB)−SAPC Ref The values for both SAAC and SAPC have a low dependence on frequency, according to an exemplary embodiment. The values may be measured in the center of the sub-band to get a composite value for use within the sub-band, according to an exemplary embodiment.

State Variable Estimation

The exact values for SAAC and SAPC are typically much more stable than individual measurements of these parameters. The exact values will therefore be calculated as the output of a state estimation filter, according to an exemplary embodiment. The form of the filter is the same for both SAAC and SAPC values, as follows, according to an exemplary embodiment:

Start-Up Sequence:

$Est(0)$=Meas(0)(*Filter is initialized with $1^{St}$ Measurement*)

$Est(1)$=[Meas(0)+Meas(1)]/2

$Est(2)$=[Meas(0)+Meas(1)+Meas(2)]/3

$Est(3)$=[Meas(0)+Meas(1)+Meas(2)+Meas(3)]/4

$Est(4)$=[Meas(0)+Meas(1)+Meas(2)+Meas(3)+Meas(4)]/5

Steady-State Sequence:

$Est(n)=Est(n-1)+k*(Meas(n)-Est(n-1))$

The parameter k defines the integration time, and may be different for each attenuation state (Optimum performance occurs when k is tailored to the expected measurement SNR), according to an exemplary embodiment. Simulation results indicate that k=0.1 gives reasonable performance at 5 dB SNR (Expected worst-case noise condition for measuring=60 dB step attenuator state), according to an exemplary embodiment.

Data Export to SSI

As the Continuous Internal Alignment Frequency Sweep Cycle is run, data must be exported to the SSI under alignment, according to an exemplary embodiment. Data transfer requirements are summarized as follows, according to an exemplary embodiment:

Data Transfer During Continuous Alignment
a. Foreground Data (Each 8 ms sweep)

| | |
|---|---|
| BSA: | 302 Words |
| BSP: | 302 Words | b. Background Data (Each 8 ms sweep; 5 out of 603 sub-bands)

| | |
|---|---|
| FIPC: | 470 Words (188 meas per sub-band (Ave)/2 meas per word) |
| FIPC Interp Coeffs: | 470 Words |
| SAAC: | 20 Words (4 Words per Sub-band) |
| SAPC: | 20 Words (4 Words per Sub-band) |

Data Transfer at Other Times (Reference)
c. Power Leveling (Once at Power-up & On command)

| | |
|---|---|
| PLO: | 302 Words | d. Amplifier Compression Sweep (Once at Power-up & On command)

| | |
|---|---|
| Super-Atten: | 7,236 Words |
| SA Interp Coeffs: | 5,427 Words |
| SIPC: | 7,236 Words |
| SIPC Interp Coeffs: | 5,427 Words | e. Pulse Alignment (On command; Requires external instrumentation)

| | |
|---|---|
| PMOD Delay Map: | 512 Words |
| PMOD Insert Delay: | 1 Word |

Data transfer must be complete by the end of the 8 ms Frequency Sweep Cycle 6053 so that the SSI has all required data when it is placed back on line, according to an exemplary embodiment. The purpose of allocating the spare 0.778 ms at the end of the cycle is to facilitate the required data transfer, according to an exemplary embodiment.

Run-Time Data Application in SSI

The following functions must be executed internal to the SSI 1001 at run-time, according to an exemplary embodiment. These functions are part of the alignment subsystem, but are allocated to the SSI 1001, instead of to the Alignment Processing Function 2025, according to an exemplary embodiment.

Building the Attenuation Map

General

Figure 8:
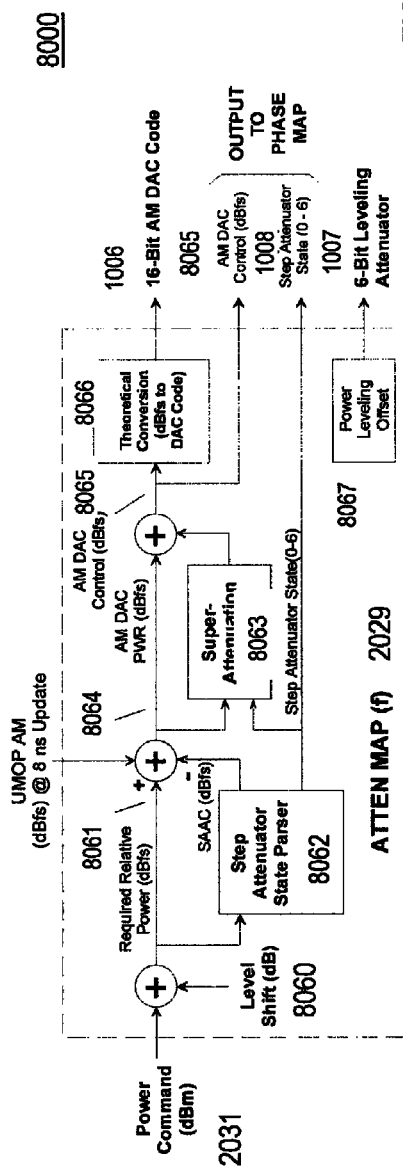
FIG. 8 illustrates an exemplary attenuation mapping function that may be used in some embodiments of the present invention.

The process for constructing the Attenuation Map 2029, according to an exemplary embodiment, is illustrated in diagram 8000 of FIG. 8. As shown, the Attenuation Map 8060, according to an exemplary embodiment, may include a level shift 8060, a parsing of the required relative power between the step attenuator and the SSI AM DAC 8062, the addition of super attenuation 8063, and a theoretical conversion 8066 of the DAC control (in dBfs) to hardware bits. In addition, the PLO data table 8067 from Power Leveling is part of the overall Attenuation Map 2029, and the output must be updated synchronously, as the frequency shifts, with updates of the output of the attenuation parsing function, according to an exemplary embodiment.

The level shift 8060 maps the absolute power command (dBm) 2031 into a required relative power (dBfs) 8061, according to an exemplary embodiment. The Step Attenuator State parsing function 8062 determines the appropriate state of the step attenuator, based on the required relative power 8061 and the stored SAAC data table, according to an exemplary embodiment. Once the appropriate step attenuator state 1008 is determined, the corresponding SAAC value is subtracted off of the relative power command to yield the residue for the AM DAC (dBfs) 8064, according to an exemplary embodiment.

The Super-Attenuation function 8063 is a quadratic interpolation of Super-Attenuation data collected during Amplifier Compression Alignment, according to an exemplary embodiment. Per Amplifier Compression Alignment, above, the data was collected in three ranges, depending upon the state of the step attenuator 1014, and the data appropriate to the Step Attenuator State (Output of the Step Attenuator State Parser) 1008 must be used, according to an exemplary embodiment. The data may span the range from 0 dBfs to −16 dBfs on the SSI AM DAC 1006 for each of the three ranges. Super-Attenuation data may be directly interpolated over this range. Most non-linearity occurs with the first few dB of attenuation, and the Super-Attenuation data will change accordingly. At higher values of attenuation, the super-attenuation data is essentially constant, and is extrapolated below −16 dB by simply re-using the −16 dB value for all higher levels of attenuation, according to an exemplary embodiment.

The appropriate super attenuation value is added to the AM DAC Residue 8064 (Addition of negative dB values), to produce the actual AM DAC Control 8065 (Saturation-Compensated, in dBfs), according to an exemplary embodiment.

There are 56 SSI base-bands, used in conjunction with 14 up-converter bands, to produce 603 sub-bands between 0.5 and 22 GHz (Not all possible combinations are used), in an exemplary embodiment. All amplitude values (Level Shift, SAAC, & Super-attenuation) are referenced to the center of the applicable SSI sub-band, and are assumed to be valid anywhere within the sub-band, according to an exemplary embodiment.

Step Attenuator State Parser

The Step-Attenuator State Parsing function 6062 takes a Required Relative Power Command (−x dBfs) and computes what state(0-6) of the Step Attenuator is required, according to an exemplary embodiment.

Note: By convention, the relative power command and all attenuation values are expressed as negative dB, according to an exemplary embodiment.

The algorithm for parsing is equivalent to the following:

SAtten_State=0;

Residue=Cmd;

Do[If[Cmd<SAAC_data[[i]], (SAtten_State=i;

Residue=Cmd−SAAC_data[[i]])],{i,1,6}];

(* Cmd is assumed to be a negative value, in dBfs. SAAC_data is the array of 6 SAAC filtered State-Estimate values (negative dB). SAtten_State is the numerical state of the Step Attenuator, 0 to 6, representing nominal 0 to −60 dB, in ten dB steps. Residue is a negative value, in dBfs, that captures the additional attenuation required on the Scaling DAC *)

DAC Theoretical Code Conversion

The AM DAC Control (dBfs) 8065, according to an exemplary embodiment, is converted to hardware code on a straight theoretical basis:

DAC_Full_Scale=32,768;(*Assumed 16 bit Scale, Bipolar*)

DAC_Code=Round[DAC_Full Scale*10^(Residue/20)];

Level Shift

The Level Shift 8060, according to an exemplary embodiment, is a frequency dependent value (1 value per sub-band) that causes the correct absolute power to be produced at the port output. It is computed such that the Base-State Power Command (i.e., −10 dBm commanded) will produce an actual output power of −10 dBm. It should be noted that the Saturation-Compensated Base State Power (SCBSP) level used for Continuous Internal Alignment is equivalent to a −10 dBm absolute power command with zero Level Shift. Thus, the difference between −10 dBm and the measured BSA is the required Level Shift at any given frequency sub-band (BSA value will typically be negative dBm):

Level Shift=−10 dBm−BSA.

Building the Phase Map

Figure 9:
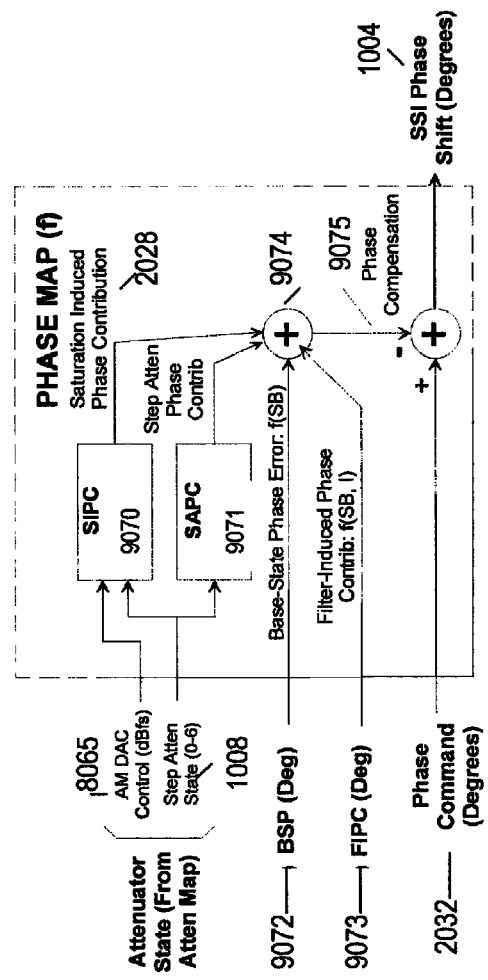
FIG. 9 illustrates an exemplary phase mapping function that may be used in some embodiments of the present invention.

The process for mapping phase is illustrated in diagram 9000 of FIG. 9, according to an exemplary embodiment. Total phase compensation 9075 is the sum of the Base-State Phase (BSP) 9072, the Step Attenuator Phase Contribution (SAPC) 9071, the Filter-Induced Phase Contribution (FIPC) 9073, and the Saturation Induced Phase Contribution (SIPC) 9070, all of which are in units of degrees, according to an exemplary embodiment.

The BSP 9072 is a single value for use anywhere within the sub-band, as is the SAPC 9071, in an exemplary embodiment. The SIPC value 9070 is valid anywhere within the sub-band, but must be interpolated from stored data to give the SIPC value that is appropriate for the current setting of the Step-Attenuator 1008 and the command going to the SSI AM DAC Control 8065 (SIPC interpolation is exactly analogous to the interpolation for super-attenuation described above), according to an exemplary embodiment.

FIPC data 9073 must be interpolated to find the FIPC that is specific to the exact frequency being produced, in an exemplary embodiment. This function may be interpolated from stored data using quadratic interpolation and the data groupings defined in Filter-Induced Phase Contribution (FIPC), above.

Once a composite phase compensation 9075 has been computed, this value is subtracted from the Phase Command 2032 to yield the phase value to be loaded into the SSI 1004, according to an exemplary embodiment.

External Measurement Port Alignment

External Measurement Port Alignment, according to an exemplary embodiment, uses the "B" Channel of the measurement receiver 2024 to measure $SSI_{1,1}$ at the output of Port 1 2021, and correlate these measurements to measurements of the same SSI 1001, under the same conditions, with a Power Meter 2027. Because the "B" Channel uses the same LO as the "A" Channel, External Measurement Port Alignment must time-share access to the measurement receiver with Continuous Internal Alignment, according to an exemplary embodiment.

Instead of sweeping all SSIs 1001 in the system, a special case of the Continuous Internal Alignment Cycle must be established that does the following, according to an exemplary embodiment:

a. Conduct Continuous Internal Alignment Frequency Sweep on $SSI_{1,1}$ (8 ms);
    b. Conduct 8 ms worth of External Measurement Port Alignment; and/or c. Repeat a & b until External Measurement Port Alignment operation is completed.

Note: Continuous Alignment of other SSIs is suspended during this operation so that measurement receiver resources may be time-shared between Continuous Internal Alignment of $SSI_{1,1}$ and the alignment of the External Measurement Port, according to an exemplary embodiment.

External Measurement Port Alignment, according to an exemplary embodiment, is a process that aligns the "B" Channel of the measurement receiver 2023. This operation is a two-step process, according to an exemplary embodiment. First, the amplitude terms for the Internal Measurement Path (IMP) for $SSI_{1,1}$ ($IAACF_{1,1}$) are aligned by placing a power meter 2027 on Port 1 2021, then alternately measuring $SSI_{1,1}$ with the external power meter 2027, and again with the internal measurement receiver 2023. The amplitude correction factors for $IMP_{1,1}$ are calculated from the difference in the internal and external readings. Once the amplitude factors for $IMP_{1,1}$ are known, the power meter is removed, and the movable test cable from the "B" channel of the measurement receiver is connected to Port 1 2021. The measurement process is repeated, this time comparing the known reading on the "A" channel ($IMP_{1,1}$) with the unknown reading on the "B" channel. The "B" channel is aligned by computing the EACF as the difference between the two readings, according to an exemplary embodiment.

The process for calibrating the measurement receiver (External "B" Channel), according to an exemplary embodiment, is summarized as follows:

a. Connect Power Meter to Port 1;
    b. Activate Modified Continuous Internal Alignment Cycle;
    c. Wait 2 seconds for alignment to stabilize;
    d. Set $SSI_{1,1}$ to Sub-band 1 & route to Port 1;
    e. Measure power on Power Meter (Using TBD VSWR Cancellation Processing);
    f. Switch $SSI_{1,1}$ & Measure with "A" Channel of Measurement Receiver, using VSWR cancellation per Section 3.1.2.2.1. Do not Normalize this measurement for path loss;
    g. Compute $IAACF_{1,1}$: $IAACF_{1,1} = P_{Power\_Meter} - P_{Meas\_Receiver}$;
    h. Repeat d through g for all 603 sub-bands;
    i. Remove the Power Meter from Port 1 and replace with the Channel B Movable Test Cable;
    j. Set $SSI_{1,1}$ to Sub-band 1 & route to Port 1;
    k. Measure power on B Channel (Using VSWR Cancellation Processing, but do not Normalize for path-loss);
    l. Switch $SSI_{1,1}$ & Measure with "A" Channel of Measurement Receiver, using VSWR cancellation per Section 3.1.2.2.1. Normalize this measurement for path loss, using the $IAACF_{1,1}$ value computed above;
    m. Compute EACF: $EACF = P_{A\_Chan,Normalized} - P_{B\_Chan,Un-normalized}$; and/or
    n. Repeat j through m for all 603 sub-bands.

Transfer Alignment of Internal Measurement Paths

Transfer alignment, according to an exemplary embodiment, computes the Internal Alignment Amplitude Correction Factor (IAACF) and Internal Alignment Phase Correction Factor (IAPCF) for each SSI 1001, the center of each sub-band. The IAACF and IAPCF values are computed by correlating measurements of the output port (Obtained from the external measurement port) with measurements from the internal alignment feedback paths, according to an exemplary embodiment. The Continuous Internal Alignment cycle needs to be running for these measurements, according to an exemplary embodiment. If the system is new and has never been aligned, the IAACF and IAPCF data tables should initially be loaded with default values (0 dB, 0 Degrees) so that Continuous Internal Alignment, which uses these values to Normalize measurements, can function, according to an exemplary embodiment. The new values for IAACF and IAPCF will be computed as an iterative update to the prior data, in an exemplary embodiment.

Because both the "A" Channel (Internal) and the "B" Channel (External) are used, and both share same LO, the frequency sweep of the SSI being measured externally must be time synchronized with the frequency sweep of the measurement receiver, according to an exemplary embodiment.

The process is summarized as follows, according to an exemplary embodiment:

a. Connect External Alignment Port Movable Test Cable to Port 1;

b. Activate the Continuous Internal Alignment process and wait 30 seconds for the system to stabilize;

c. Rout $SSI_{1,1}$ to Port 1 output, and sweep in frequency in parallel with the foreground portion of the Internal Alignment Frequency Sweep Cycle (Base-state amplitude & Phase). Record Normalized Amplitude and Phase Measurements on "B" Channel;

d. Compute Amplitude Error (dB) for each sub-band edge as follows:

Amp_Error=Normalized Amplitude$_{B\ Char}$+10 dB;

e. Compute Phase Error (dB) for each sub-band edge as follows:

Phase_Error=Normalized Phase$_{B\ Chan}$;

f. Iterate IAACF value (dB) for each sub-band as follows:

IAACF$_{n+1}$=IAACF$_n$+Amp_Error;

g. Iterate IAPCF value (Degrees) for each sub-band as follows:

IAPCF$_{n+1}$=IAPCF$_n$+Phase Error;

h. Repeat steps c thru g for each SSI on port 1; and/or i. Repeat steps a thru h for each port (2-16).

Time of Arrival Alignment

Time of Arrival Alignment (as shown in diagram 10000 of FIG. 10) has three aspects, as follows, according to an exemplary embodiment:

a. Hardware Transfer Function Linearization;

b. Hardware Transfer Function Gain Scaling; and/or c. System Inter-channel Delay.

All processes are run using a Digital O-Scope 2026 (See FIG. 2) to measure the pulse time of arrival of each SSI with respect to a $SSI_{1,1}$ (System Reference), according to an exemplary embodiment. Normally, this is done as a two-channel O-scope measurement, but on Port 1, multiple SSIs will appear on the same channel, according to an exemplary embodiment. For Port 1, therefore, it is necessary to measure timing using the waveform shown in FIG. 10, according to an exemplary embodiment. As shown, the measurement waveform is a periodic couplet, in which the first pulse of the pair is the $SSI_{1,1}$ reference 10002, and the SSI under alignment is the second pulse 10004 of the pair, according to an exemplary embodiment.

Note: When measuring delay characteristics for $SSI_{1,1}$, it can be used as its own trigger reference, in accordance with the scheme shown in FIG. 10. In this case, both pulses are from $SSI_{1,1}$, the first to serve as a trigger reference, and the seconds to measure programmed incremental delay.

Transfer Function Linearization

There is a table of 1024 values dedicated as the characterization map for pulse modulation (PMOD) Fine Delay, according to an exemplary embodiment. The basic clock resolution for PMOD is 8 ns, but a delay line is used to provide 8 ps interpolation of the 8 ns clock, in an exemplary embodiment. The delay-line has multiple taps, and the taps may not be perfectly weighted with respect to each other, according to an exemplary embodiment. A purpose of this map is to remove non-linearity and non-monotonicity in the hardware transfer function that results from imperfect weighting of the various taps, according to an exemplary embodiment. This alignment is expected to be a one-time-only factory characterization, in an exemplary embodiment.

The linearization process, according to an exemplary embodiment, may involve measuring, in steps of 8 ps, the hardware bit pattern required to produce the desired delay. This process should be implemented in a manner similar to the iterative search used to map amplifier compression (see Search Algorithm, above), wherein the nominal value is used as an initial estimate, the actual delay is measured and the error computed, and the estimate is adjusted by the error, according to an exemplary embodiment.

The resulting data table is the numerical sequence of hardware bit patterns to produce a linear, monotonic delay characteristic, according to an exemplary embodiment. This characteristic data may be stored in non-volatile Flash Memory in each SSI Digital Controller, according to an exemplary embodiment.

Transfer Function Gain Scaling

A purpose of gain scaling, according to an exemplary embodiment, is to keep the full-scale delay of the interpolating delay line equal to the 8 ns clock resolution. (The delay-line elements may change by as much as ±2 ns over the range of temperature extremes for a flight-line system.) Gain scaling may be implemented on command, based on significant change in system temperature, according to an exemplary embodiment.

The Transfer Function Linearization characteristic data described above is a look-up table that maps a delay command (ps) into a specific bit pattern for the hardware, according to an exemplary embodiment. This table is read from the SSI non-volatile flash memory, and is copied into the Alignment Processing RAM memory when the SSIs are powered-on, according to an exemplary embodiment.

Gain scaling may include requesting a measurement from the SSI (Conducted as an internal clock-management measurement) of the error between the 8 ns digital clock period and the full-scale value of the linearization characteristic, in an exemplary embodiment. The measured error is used to scale the address range of the Linearization Characteristic so as to build a look-up table that is a properly scaled mapping of delay command (in ps) to actual hardware bit patterns that will cause the desired delay, according to an exemplary embodiment.

Alignment of Insertion Delay

Time of Arrival Alignment is a process that measures differences in channel-to-channel pulse time of arrival between each SSI, and may apply trim compensation if required, according to an exemplary embodiment. Time of Arrival alignment may be run on-command (Not while simulations are active), according to an exemplary embodiment.

Each SSI has 2 offset registers; one to adjust leading edge delay and the other to adjust trailing edge delay, according to an exemplary embodiment. $SSI_{1,1}$ serves as the system reference. The leading edge register for this SSI is loaded with a Reference Insertion Delay (Nominally, 16 ns), in an exemplary embodiment. The insertion delay for all other SSIs is aligned as follows:

a. Set Leading Edge Delay (LED) to Reference Delay (16 ns);
b. Measure SSI Under Test pulse timing WRT $SR_{1,1}$;
c. Compute Error: Error=$Time_{SSIn}$-$Time_{SSI1,1}$;
d. Leading Edge Delay: $LED_{n+1}$=$LED_n$-Error;
e. Adjust Trailing Edge Delay: $TED_{n+1}$=$TED_n$-Error; and/or f. Iterate if required.

Note: The purpose of adjusting the Trailing Edge Delay whenever Leading Edge Delay is adjusted is to ensure that Alignment of Insertion Delay does not interact with Pulse Width Alignment, according to an exemplary embodiment.

Pulse Width Alignment

Pulse Width Alignment, according to an exemplary embodiment, may be implemented by using a Digital O-Scope 2026 (See FIG. 2) to measure the pulse width of each SSI 1001.

Pulse width is adjusted, if required by programming the Trailing Edge Delay register, according to an exemplary embodiment. The process is as follows, according to an exemplary embodiment:

a. Measure SSI Under Test pulse width;
b. Compute Error: Error=$PW_{Meas}$-$PW_{Nominal}$;
c. Adjust Trailing Edge Delay: $TED_{n+1}$=$TED_n$-Error; and/or d. Iterate if required.

While various embodiments of the present invention have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed is:

1. A method for using a "B" channel of a dual channel measurement receiver as a transfer standard for power measurement comprising:

correlating measurements made with an "A" channel to measurements made with an RF Power Meter on one RF signal source, so that readings from the "A" channel are aligned to the RF Power Meter;

aligning the "B" Channel to the "A" Channel (Transfer alignment of Channel B to the RF Power Meter), once the "A" channel has been aligned to read the same as the RF Power Meter; and using the "B" Channel as a transfer standard to measure all remaining RF signal sources in the system, on a timeline much faster than may be accomplished using a power meter.

* * * * *